US012796276B2

(12) United States Patent
Ma et al.

(10) Patent No.: US 12,796,276 B2
(45) Date of Patent: Nov. 10, 2026

(54) COLOR CONVERSION SUBSTRATE WITH BANK LAYER OF VARYING WIDTHS AND DISPLAY APPARATUS THEREOF

(71) Applicants: Chengdu BOE Optoelectronics Technology Co., Ltd., Chengdu (CN); BOE Technology Group Co., Ltd., Beijing (CN)

(72) Inventors: Lulin Ma, Beijing (CN); Dan Wang, Beijing (CN); Guangri Yu, Beijing (CN); Cheng Zeng, Beijing (CN); Jinglu Bai, Beijing (CN); Zhenye Wei, Beijing (CN); Qiyun Wang, Beijing (CN); Lihui Luo, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 295 days.

(21) Appl. No.: 18/727,158

(22) PCT Filed: Oct. 26, 2023

(86) PCT No.: PCT/CN2023/126773
§ 371 (c)(1),
(2) Date: Jul. 8, 2024

(87) PCT Pub. No.: WO2025/086196
PCT Pub. Date: May 1, 2025

(65) Prior Publication Data
US 2026/0182197 A1 Jun. 25, 2026

(51) Int. Cl.
*H10K 59/38* (2023.01)

(52) U.S. Cl.
CPC .................................. *H10K 59/38* (2023.02)

(58) Field of Classification Search
CPC ..................................................... H10K 59/38
See application file for complete search history.

(56) References Cited

U.S. PATENT DOCUMENTS

2021/0399068 A1 12/2021 Kim et al.
2022/0115612 A1* 4/2022 Ahn .................... H10K 50/115
(Continued)

FOREIGN PATENT DOCUMENTS

CN 202126516 U 1/2012
CN 113540188 A 10/2021
(Continued)

OTHER PUBLICATIONS

International Search Report & Written Opinion mailed Dec. 22, 2023, regarding PCT/CN2023/126773.

*Primary Examiner* — John P. Dulka
(74) *Attorney, Agent, or Firm* — Intellectual Vallev Law, P.C.

(57) ABSTRACT

A color conversion substrate includes a bank layer; a plurality of first apertures; and a color conversion layer including a plurality of color conversion blocks. A respective color conversion block is at least partially in a first aperture of the plurality of first apertures. Along a plane intersecting two adjacent subpixels and perpendicular to a surface of a base substrate, a cross-section of a portion of the bank layer between two adjacent color conversion blocks transitions from a first width, to a second width, to a third width, and to a fourth width, along a direction from a respective light emitting element to a respective color filter block configured to receive light emitted from the respective light emitting element. The third width is greater than the first width. The first width is greater than the second width. The second width is equal to or greater than the fourth width.

20 Claims, 26 Drawing Sheets

(56) References Cited

U.S. PATENT DOCUMENTS

| | | | | |
|---|---|---|---|---|
| 2022/0392961 | A1* | 12/2022 | Kim | H10K 59/38 |
| 2025/0072255 | A1* | 2/2025 | Shin | H10K 59/1201 |

FOREIGN PATENT DOCUMENTS

| | | | |
|---|---|---|---|
| CN | 114846619 | A | 8/2022 |
| CN | 114864635 | A | 8/2022 |
| CN | 115268157 | A | 11/2022 |
| CN | 115768215 | A | 3/2023 |
| CN | 116171085 | A | 5/2023 |
| CN | 116367653 | A | 6/2023 |
| KR | 20200072740 | A | 6/2020 |
| WO | 2022241661 | A1 | 11/2022 |
| WO | 2022257062 | A1 | 12/2022 |

* cited by examiner

COLOR CONVERSION SUBSTRATE WITH BANK LAYER OF VARYING WIDTHS AND DISPLAY APPARATUS THEREOF

CROSS-REFERENCE TO RELATED APPLICATION

This application is a national stage application under 35 U.S.C. § 371 of International Application No. PCT/CN2023/126773, filed Oct. 26, 2023, the contents of which are incorporated by reference in the entirety.

TECHNICAL FIELD

The present invention relates to display technology, more particularly, to a color conversion substrate and a display apparatus.

BACKGROUND

Quantum dots material has excellent optical and electrical properties, including a narrow emission peak (with a half-peak width of approximately 30 nm), a tunable spectrum (ranging from visible light to infrared light), high photochemical stability, and a low starting voltage. Wavelengths of light emitted from quantum dots materials are tunable at least in part based on the particle sizes of the quantum dots. Due to these excellent properties, quantum dots have become a focus of research and development in the fields of display technology.

SUMMARY

In one aspect, the present disclosure provides a color conversion substrate, comprising a bank layer; a plurality of first apertures extending through the bank layer; and a color conversion layer comprising a plurality of color conversion blocks; wherein a respective color conversion block of the plurality of color conversion blocks is at least partially in a first aperture of the plurality of first apertures; along a plane intersecting two adjacent subpixels and perpendicular to a surface of a base substrate, a cross-section of a portion of the bank layer between two adjacent color conversion blocks transitions from a first width, to a second width, to a third width, and to a fourth width, along a direction from a respective light emitting element to a respective color filter block configured to receive light emitted from the respective light emitting element; the third width is greater than the first width; the first width is greater than the second width; and the second width is equal to or greater than the fourth width.

Optionally, a ratio of a difference between the third width and the second width to the third width is equal to or less than 0.1.

Optionally, between two adjacent color conversion blocks, the bank layer comprises a first bank portion, a second bank portion on the first bank portion, and a third bank portion on a side of the second bank portion away from the first bank portion; wherein, along the plane intersecting two adjacent subpixels and perpendicular to the surface of the base substrate: a cross-section of the first bank portion has a first side having the first width and a second side having the second width, the second side being opposite to the first side; a cross-section of the second bank portion has a third side having the second width and a fourth side having the third width, the fourth side being opposite to the third side; a cross-section of the third bank portion has a fifth side having the third width and a sixth side having the fourth width, the sixth side being opposite to the fifth side; the portion of the bank layer has a first thickness; the third bank portion has a second thickness; and the first bank portion has a third thickness.

Optionally, a ratio of the third width to the first thickness is equal to or greater than 1, and equal to or less than 2.

Optionally, a ratio of the second thickness to the first thickness is equal to or greater than 0.3, and is equal to or less than 0.7.

Optionally, a ratio of the third thickness to the first thickness is equal to or less than 0.2.

Optionally, the color conversion substrate further comprises a first groove recessing into the bank layer along a direction from the respective color filter block configured to receive light emitted from the respective light emitting element to the respective light emitting element.

Optionally, the color conversion substrate further comprises a residual material in the first groove; wherein the residual material comprises at least one of quantum dots or light scattering particles.

Optionally, the color conversion substrate further comprises a second encapsulating layer on a side of the bank layer and the color conversion layer away from the base substrate; wherein the second encapsulating layer comprises a protrusion protruding into the first groove.

Optionally, the color conversion substrate further comprises a second groove recessing into the second encapsulating layer along the direction from the respective color filter block configured to receive light emitted from the respective light emitting element to the respective light emitting element.

Optionally, the color conversion substrate further comprises a black matrix and a color filter on a side of the second encapsulating layer away from the base substrate; and a gap extending through the color filter, dividing the color filter into a plurality of color filter blocks; wherein the black matrix extends through the gap and extends into the second groove.

Optionally, an orthographic projection of the black matrix on the base substrate substantially covers an orthographic projection of edges of the second groove on the base substrate; an orthographic projection of the black matrix on the base substrate substantially covers an orthographic projection of the protrusion on the base substrate; and an orthographic projection of the bank layer on the base substrate substantially covers the orthographic projection of the protrusion on the base substrate.

Optionally, the color conversion substrate further comprises a residual material in the first groove; wherein the residual material comprises at least one of quantum dots or light scattering particles; and the protrusion is in direct contact with the residual material.

Optionally, between two adjacent color conversion blocks, the bank layer comprises a first bank portion, a second bank portion on the first bank portion, and a third bank portion on a side of the second bank portion away from the first bank portion; the first groove recesses into the third bank portion; the portion of the bank layer has a first thickness; and the first groove has a depth along the direction from the respective light emitting element to the respective color filter block configured to receive light emitted from the respective light emitting element; wherein a ratio of the depth to the first thickness is equal to or less than 0.5.

Optionally, along the plane intersecting two adjacent subpixels and perpendicular to the surface of the base substrate, a respective wall of two walls forming two opposite sides of the first groove has a fifth width, the first groove has a sixth width, and a cross-section of the first groove has a rectangular shape; and a ratio of the third width to the sixth width is equal to or greater than 3.

Optionally, the third width is equal to or greater than a sum of the sixth width and two times of the fifth width.

Optionally, along the plane intersecting two adjacent subpixels and perpendicular to the surface of the base substrate, a cross-section of the first groove has a shape having a first base and a second base, wherein the first base is on a bottom of the first groove, and the second base is opposite to the first base; the first base has a seventh width; the second base has an eighth width; and a ratio of the eighth width to the seventh width is equal to or greater than 1, and equal to or less than 1.5.

Optionally, a ratio of the third width to the seventh width is equal to or greater than 3.

Optionally, the color conversion substrate further comprises a second encapsulating layer on a side of the bank layer and the color conversion layer away from the base substrate; and a black matrix and a color filter on a side of the second encapsulating layer away from the base substrate; wherein the black matrix comprises a portion on a side of the color filter away from the base substrate; along the plane intersecting two adjacent subpixels and perpendicular to the surface of the base substrate, a cross-section of the portion of the black matrix in a light non-transmissive region between two adjacent light transmissive regions has a first base having a first base width, a second base having a second base width, and a first base angle between the first base and a leg of the cross-section, the first base and the second base being opposite to each other; the second base is on a side of the first base away from the base substrate; and along the plane intersecting two adjacent subpixels and perpendicular to the surface of the base substrate, the portion of the black matrix in the light non-transmissive region between two adjacent light transmissive regions has a thickness; wherein a ratio of the first base width to the thickness is equal to or greater than 1, and equal to or less than 4; a ratio of the second base width to the first base width is equal to or greater than 0.75, and equal to or less than 1; and the first base angle is equal to or greater than 60 degrees, and equal to or less than 90 degrees.

Optionally, the color conversion substrate further comprises a second encapsulating layer on a side of the bank layer and the color conversion layer away from the base substrate; and a black matrix and a color filter on a side of the second encapsulating layer away from the base substrate; wherein the black matrix comprises a portion on a side of the color filter away from the base substrate; along the plane intersecting two adjacent subpixels and perpendicular to the surface of the base substrate, a width of a cross-section of the portion of the black matrix in a light non-transmissive region between two adjacent light transmissive regions transitions from a first base width, to a maximum width, and to a second base width, along the direction from the respective light emitting element to the respective color filter block configured to receive light emitted from the respective light emitting element; and along the plane intersecting two adjacent subpixels and perpendicular to the surface of the base substrate, a cross-section of the portion of the black matrix in a light non-transmissive region between two adjacent light transmissive regions has a first base angle between a first base and a leg of the cross-section, and the portion of the black matrix in the light non-transmissive region between two adjacent light transmissive regions has a thickness; wherein a ratio of the maximum width to the thickness is equal to or greater than 1, and equal to or less than 4; a ratio of the first base width to the maximum width is equal to or greater than 0.75, and equal to or less than 1; a ratio of the second base width to the maximum width is equal to or greater than 0.75, and equal to or less than 1; and the first base angle is equal to or greater than 60 degrees, and equal to or less than 90 degrees.

In another aspect, the present disclosure provides a display apparatus, comprising the color conversion substrate described herein, and a light emitting substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a color conversion substrate and a display apparatus that substantially obviate one or more of the problems due to limitations and disadvantages of the related art. In one aspect, the present disclosure provides a color conversion substrate. In some embodiments, the color conversion substrate includes a bank layer; a plurality of first apertures extending through the bank layer; and a color conversion layer comprising a plurality of color conversion blocks. Optionally, a respective color conversion block of the plurality of color conversion blocks is at least partially in a first aperture of the plurality of first apertures. Optionally, along a plane intersecting two adjacent subpixels and perpendicular to a surface of a base substrate, a cross-section of a portion of the bank layer between two adjacent color conversion blocks transitions from a first width, to a second width, to a third width, and to a fourth width, along a direction from a respective light emitting element to a respective color filter block configured to receive light emitted from the respective light emitting element. Optionally, the third width is greater than the first width. Optionally, the first width is greater than the second width. Optionally, the second width is equal to or greater than the fourth width.

Figure 1:
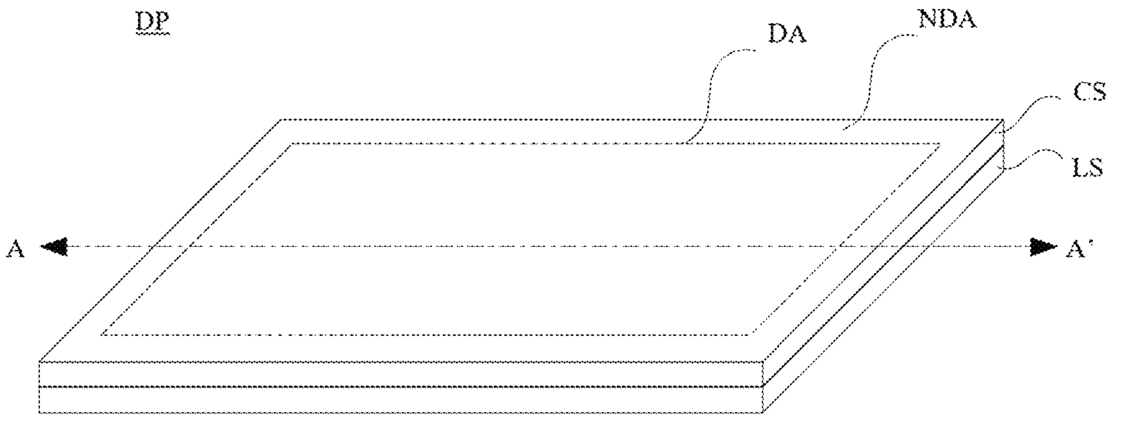
FIG. 1 is a schematic diagram illustrating the structure of a display panel in some embodiments according to the present disclosure.
Figure 2:
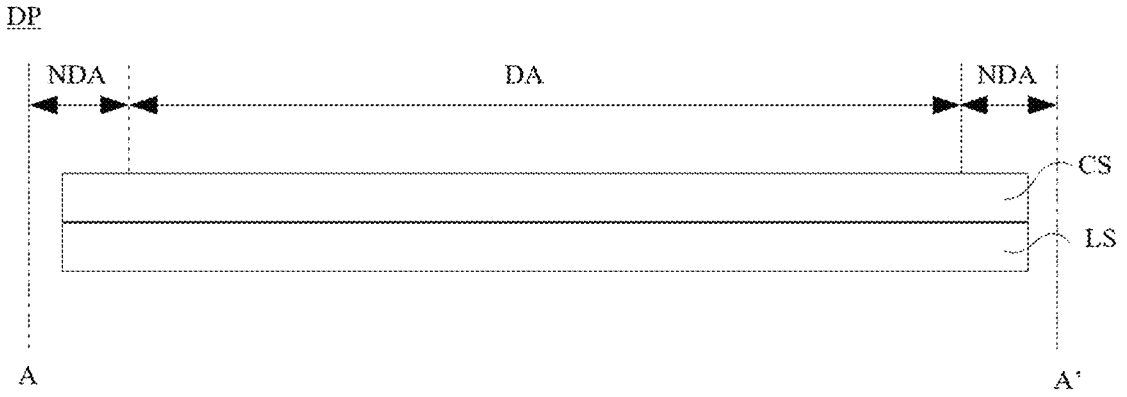
FIG. 2 is a cross-sectional view along an A-A' line in FIG. 1.

FIG. 1 is a schematic diagram illustrating the structure of a display panel in some embodiments according to the present disclosure. FIG. 2 is a cross-sectional view along an A-A line in FIG. 1. Referring to FIG. 1 and FIG. 2, the display panel DP in some embodiments includes a light emitting substrate LS, a color conversion substrate CS, and a spacer layer SL spacing apart the light emitting substrate LS and the color conversion substrate CS. The display panel DP includes a display area DA and a non-display area NDA.

Figure 3:
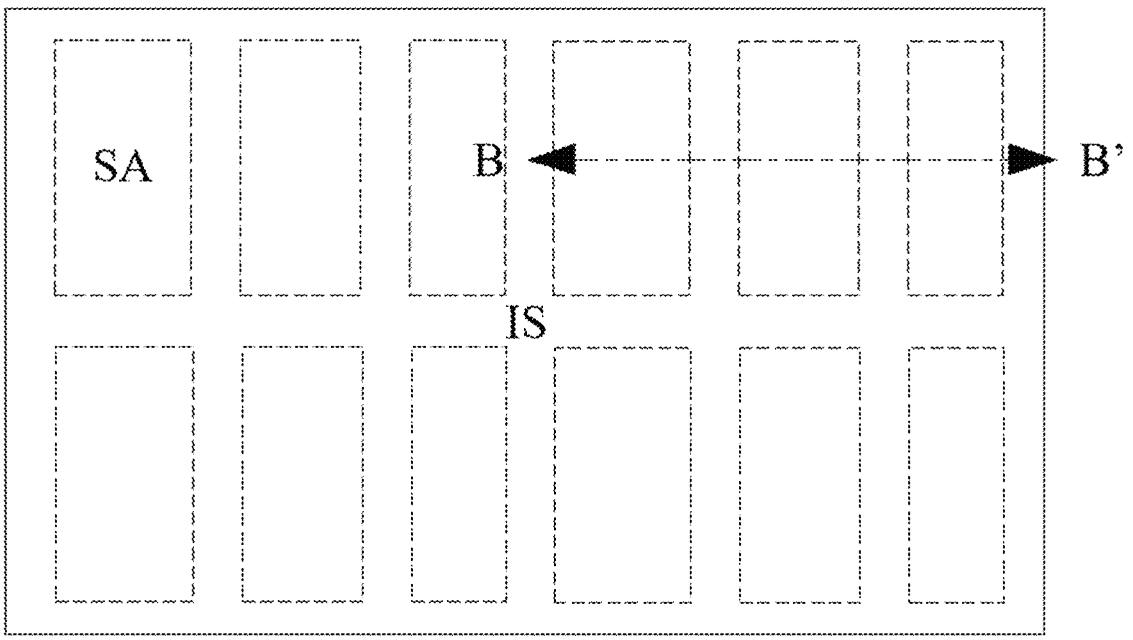
FIG. 3 is a plan view of a display panel in some embodiments according to the present disclosure.

FIG. 3 is a plan view of a display panel in some embodiments according to the present disclosure. Referring to FIG. 3, the display panel in some embodiments includes a plurality of subpixel regions SR and an inter-subpixel region ISR. As used herein, a subpixel region refers to a light emission region of a subpixel, such as a region corresponding to a pixel electrode in a liquid crystal display, or a region corresponding to a light emissive layer in a light emitting diode display panel, or a region corresponding to a color conversion block in a display panel according to the present disclosure. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel. As used herein, an inter-subpixel region refers to a region between adjacent subpixel regions, such as a region corresponding to a black matrix in a liquid crystal display, or a region corresponding a pixel definition layer in a light emitting diode display panel, or a region corresponding to a bank layer in a display panel according to the present disclosure. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

Various appropriate implementations may be practiced to make a display panel of the present disclosure. In one example, a light emitting substrate and a color conversion substrate are fabricated respectively, and then assembled together using a filler layer into a display panel. In another example, the color conversion substrate is directly fabricated on the light emitting substrate.

Figure 4:
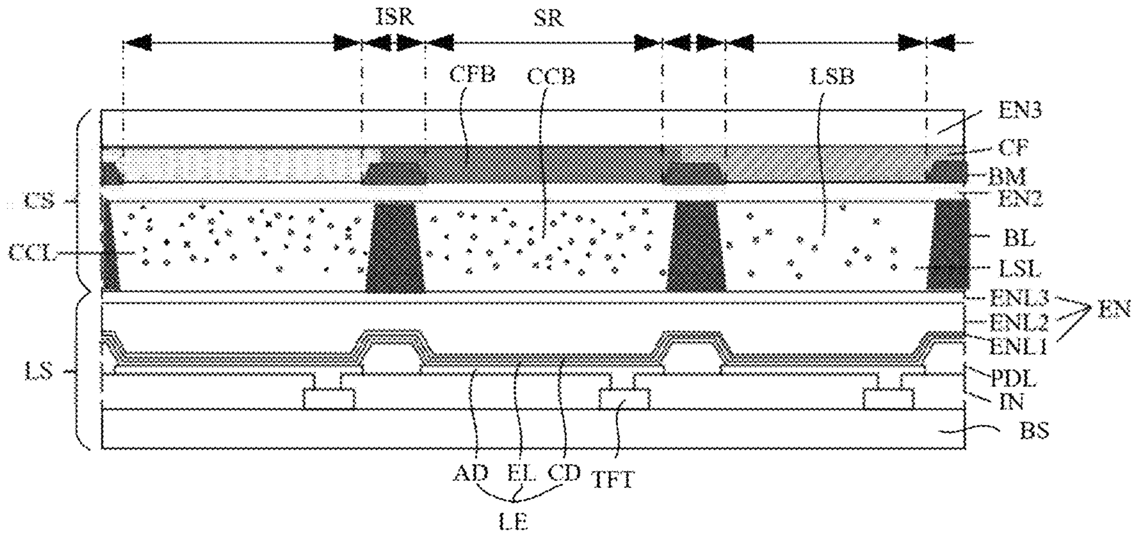
FIG. 4 is a cross-sectional view of a display panel in some embodiments according to the present disclosure.
Figure 5:
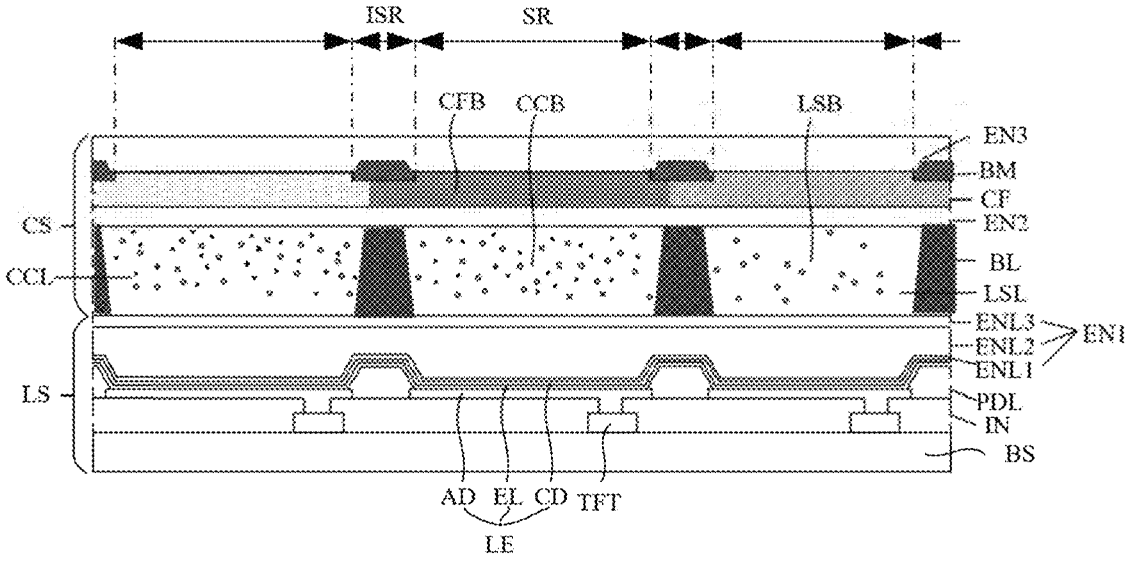
FIG. 5 is a cross-sectional view of a display panel in some embodiments according to the present disclosure.

FIG. 4 is a cross-sectional view of a display panel in some embodiments according to the present disclosure. FIG. 5 is a cross-sectional view of a display panel in some embodiments according to the present disclosure. Referring to FIG. 4 and FIG. 5, the display panel in some embodiments includes a light emitting substrate LS and a color conversion substrate CS. The light emitting substrate LS and the color conversion substrate CS are assembled together.

Referring to FIG. 4 and FIG. 5, in some embodiments, the light emitting substrate LS includes a base substrate BS; a plurality of thin film transistor TFT (e.g., transistors in pixel driving circuits) on the base substrate BS; an insulating layer IN on a side of the plurality of transistor TFT away from the base substrate BS; a pixel definition layer PDL and a plurality of light emitting elements LE on a side of the insulating layer IN away from the base substrate BS; and a first encapsulating layer EN1 on a side of the plurality of light emitting elements LE and the pixel definition layer PDL away from the base substrate BS. A respective light emitting element of the plurality of light emitting elements LE includes an anode AD, a light emitting layer EL on a side of the anode AD away from the base substrate BS, and a cathode CD on a side of the light emitting layer EL away from the base substrate BS. In one example, the first encapsulating layer EN1 include a first inorganic encapsulating sublayer ENL1, an organic encapsulating sublayer ENL2 on a side of the first inorganic encapsulating sublayer ENL1 away from the base substrate BS, and a second inorganic encapsulating sublayer ENL3 on a side of the organic encapsulating sublayer ENL2 away from the base substrate BS.

Referring to FIG. 4 and FIG. 5, in some embodiments, the color conversion substrate CS includes a bank layer BL defining a plurality of first apertures, a color conversion layer CCL and a light scattering layer LSL at least partially in the plurality of first apertures defined by the bank layer BL. The color conversion layer CCL includes a plurality of color conversion blocks CCB. The light scattering layer LSL includes a plurality of light scattering blocks LSB.

The color conversion substrate CS in some embodiments further includes a second encapsulating layer EN2 on a side of the bank layer BL, the color conversion layer CCL, and the light scattering layer LSL, encapsulating the color conversion layer CCL and the light scattering layer LSL.

The color conversion substrate CS in some embodiments further includes a color filter CF on the color conversion layer CCL and the light scattering layer LSL. In one example, the color filter CF is on a side of the second encapsulating layer EN2 away from the color conversion layer CCL and the light scattering layer LSL. The color filter CF includes a plurality of color filter blocks CFB. An orthographic projection of a respective color filter block of the plurality of color filter blocks CFB on a base substrate at least partially overlaps with an orthographic projection of a respective color conversion block or a respective light scattering block on the base substrate. Orthographic projections of adjacent color filter blocks may partially overlap with each other, e.g., along the edges.

The color conversion substrate CS in some embodiments further includes a black matrix BM on the color conversion layer CCL and the light scattering layer LSL. In one example, the black matrix BM is on a side of the second encapsulating layer EN2 away from the color conversion layer CCL and the light scattering layer LSL. The black matrix BM is in the inter-subpixel region ISR. A respective color filter block, a respective color conversion block, or a respective light scattering block is at least partially in an individual subpixel region.

The color conversion substrate CS in some embodiments further includes a third encapsulating layer EN3 on a side of the color filter CF and the black matrix away from the color conversion layer CCL and the light scattering layer LSL, encapsulating the color filter CF.

In some embodiments, referring to FIG. 4, the color filter CF is on a side of the black matrix BM away from the color conversion layer CCL and the light scattering layer LSL. In one example, the black matrix BM is in direct contact with the second encapsulating layer EN2.

In some embodiments, referring to FIG. 5, the black matrix BM is on a side of the color filter CF away from the color conversion layer CCL and the light scattering layer LSL. In one example, the black matrix BM is not in direct contact with the second encapsulating layer EN2. In another example, the color filter CF spaces apart the black matrix BM from the second encapsulating layer EN2.

In some embodiments, the display panel is a quantum dots display panel. In a quantum dots display panel, a light source (e.g., a blue light source) is used to excite quantum dots to emit light based on the photoluminescence excitation principle. In some embodiments, the plurality of color conversion blocks CCB include a first color conversion block and a second color conversion block. In one example, the first color conversion block is configured to convert a light of a third color (e.g., a blue light) into a light of a first color (e.g., a red light). In another example, the second color conversion block is configured to convert the light of the third color (e.g., a blue light) into a light of a second color (e.g., a green light). The plurality of light scattering blocks LSB do not convert a color of the incident light. Optionally, the plurality of light scattering blocks LSB are configured to scatter the incident light (e.g., a blue light), which emits through a color filter block for image display. The plurality of color filter blocks CFB includes a color filter block of a first color (e.g., a red color filter block) corresponding to the first color conversion block, a color filter block of a second color (e.g., a green color filter block) corresponding to the second color conversion block, and a color filter block of a third color (e.g., a blue color filter block) corresponding to a light scattering block.

Figure 6A:
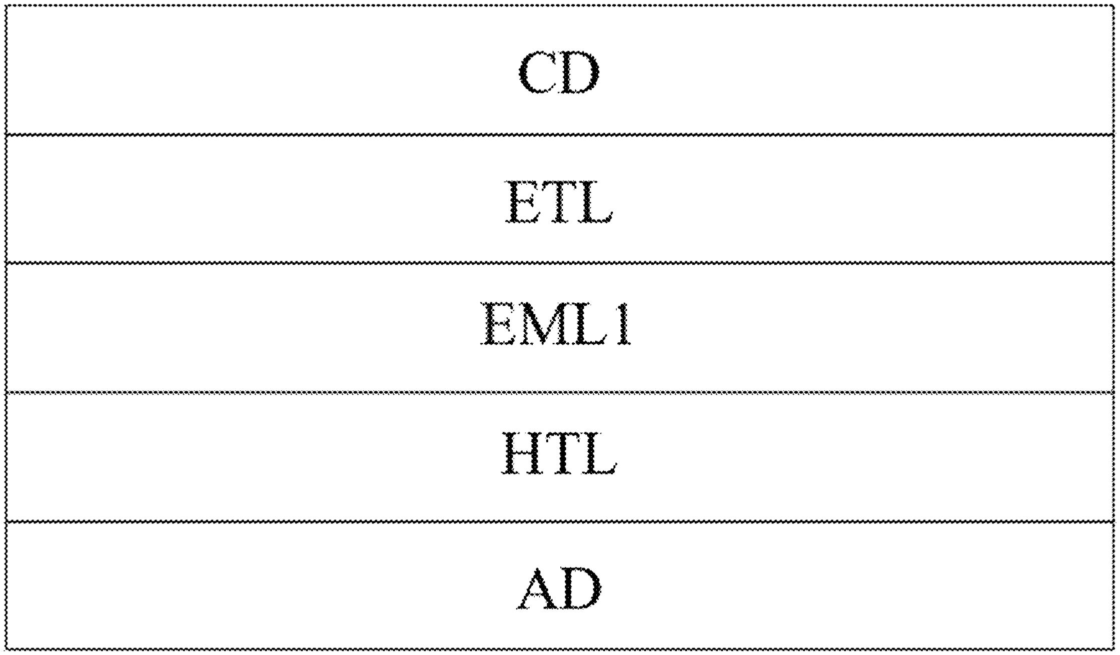
FIG. 6A is a schematic diagram illustrating the structure of a light emitting element in some embodiments according to the present disclosure.

Various appropriate light emitting elements may be implemented in the display panel according to the present disclosure. FIG. 6A is a schematic diagram illustrating the structure of a light emitting element in some embodiments according to the present disclosure. Referring to FIG. 6A, the light emitting element in some embodiments includes an anode AD, a hole transport layer HTL on the anode AD, a first light emitting layer EML1 on a side of the hole transport layer HTL away from the anode AD, an electron transport layer ETL on a side of the first light emitting layer EML1 away from the hole transport layer HTL, and a cathode CD on a side of the electron transport layer ETL away from the first light emitting layer EML1.

Figure 6B:
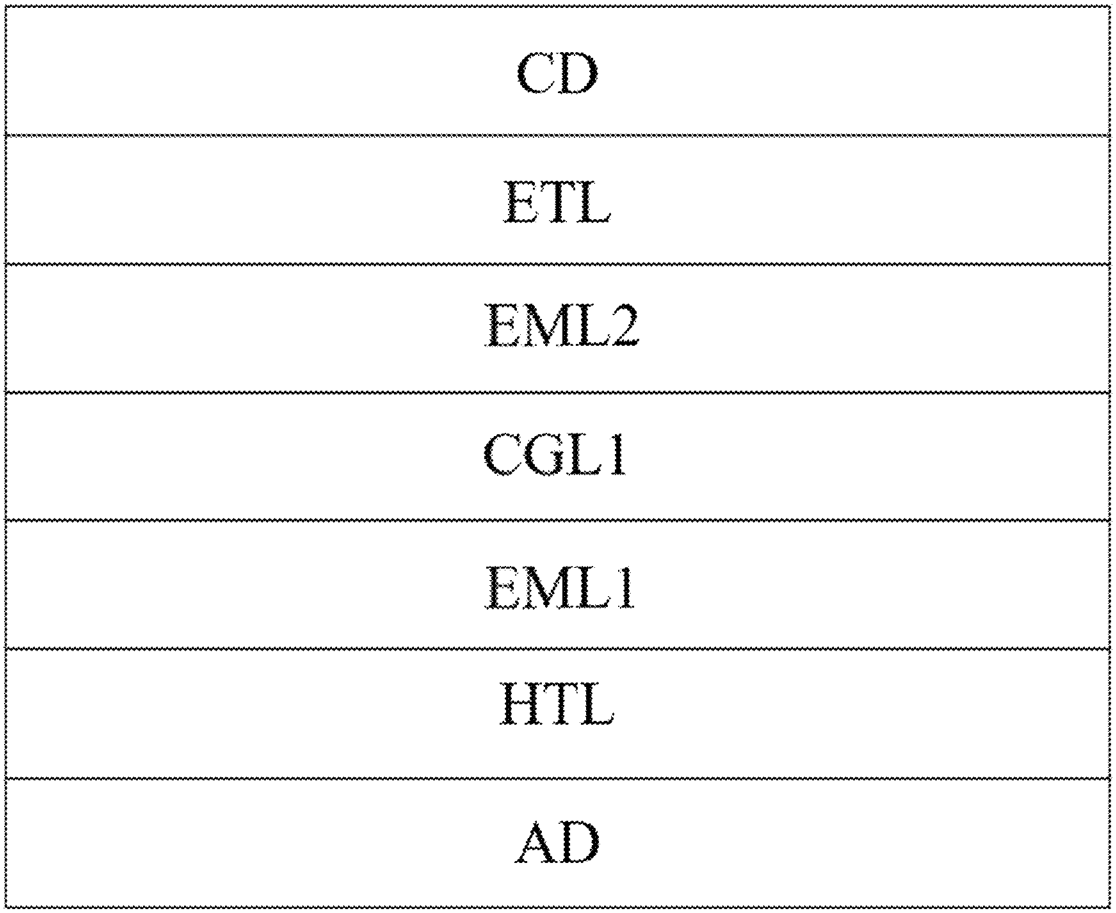
FIG. 6B is a schematic diagram illustrating the structure of a light emitting element in some embodiments according to the present disclosure.

In some embodiments, the light emitting element may have a stacked structure. FIG. 6B is a schematic diagram illustrating the structure of a light emitting element in some embodiments according to the present disclosure. Referring to FIG. 6B, the light emitting element in some embodiments includes an anode AD, a hole transport layer HTL on the anode AD, a first light emitting layer EML1 on a side of the hole transport layer HTL away from the anode AD, a first charge generation layer CGL1 on a side of the first light emitting layer EML1 away from the hole transport layer HTL, a second light emitting layer EML2 on a side of the first charge generation layer CGL1 away from the first light emitting layer EML1, an electron transport layer ETL on a side of the second light emitting layer EML2 away from the first charge generation layer CGL1, and a cathode CD on a side of the electron transport layer ETL away from the second light emitting layer EML2.

Figure 6C:
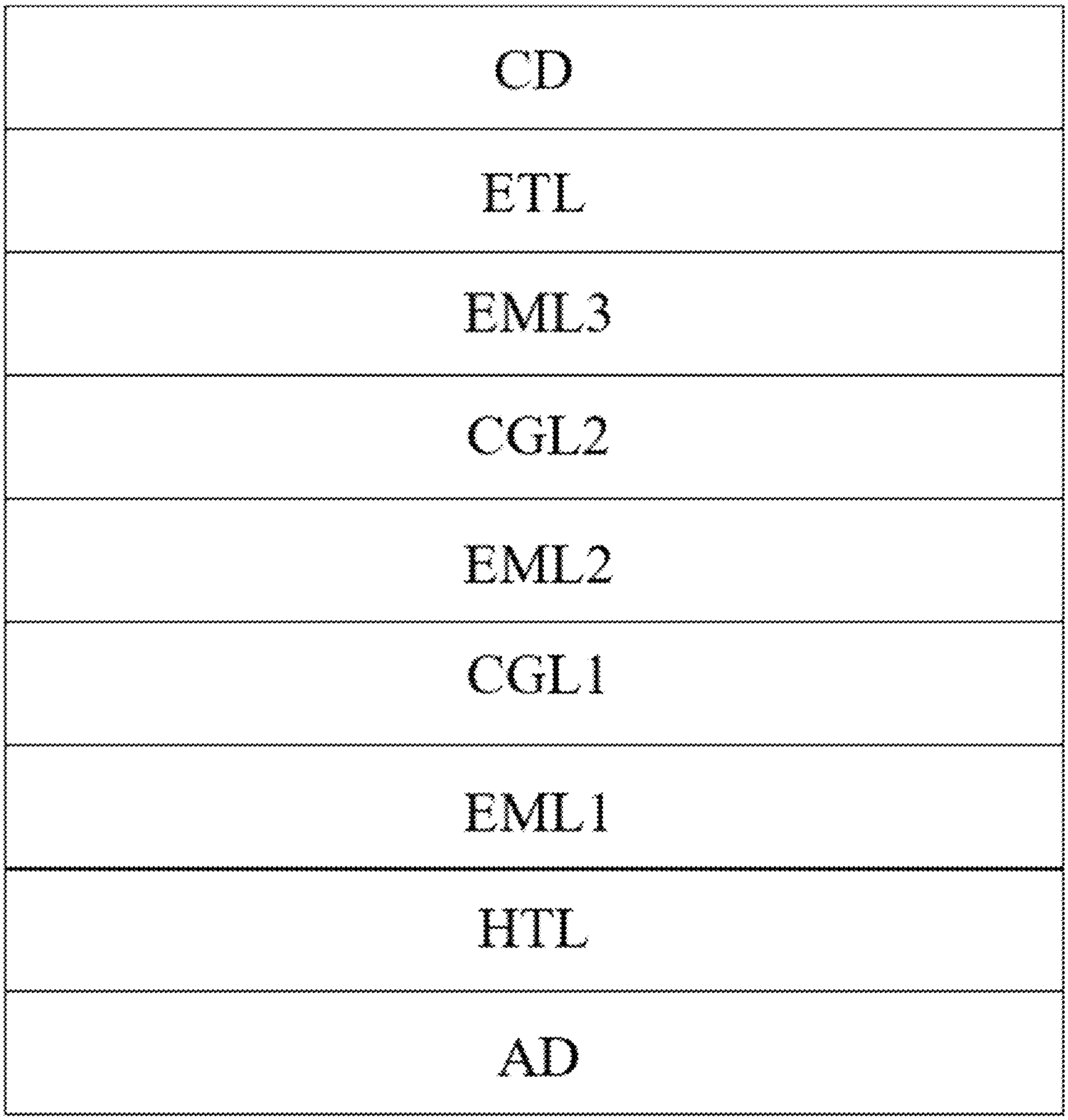
FIG. 6C is a schematic diagram illustrating the structure of a light emitting element in some embodiments according to the present disclosure.

FIG. 6C is a schematic diagram illustrating the structure of a light emitting element in some embodiments according to the present disclosure. Referring to FIG. 6C, the light emitting element in some embodiments includes an anode AD, a hole transport layer HTL on the anode AD, a first light emitting layer EML1 on a side of the hole transport layer HTL away from the anode AD, a first charge generation layer CGL1 on a side of the first light emitting layer EML1 away from the hole transport layer HTL, a second light emitting layer EML2 on a side of the first charge generation layer CGL1 away from the first light emitting layer EML1, a second charge generation layer CGL2 on a side of the second light emitting layer EML2 away from the first charge generation layer CGL1, a third light emitting layer EML3 on a side of the second charge generation layer CGL2 away from the second light emitting layer EML2, an electron transport layer ETL on a side of the third light emitting layer EML3 away from the second charge generation layer CGL2, and a cathode CD on a side of the electron transport layer ETL away from the third light emitting layer EML3.

Figure 7A:
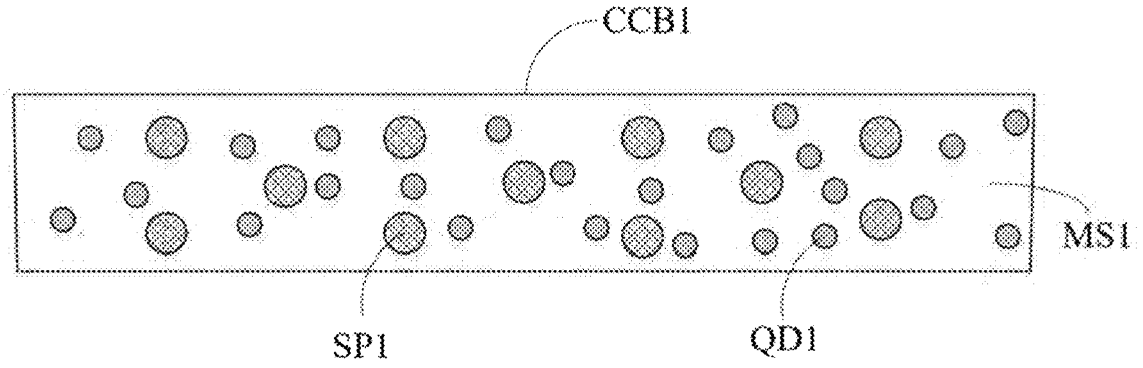
FIG. 7A is a schematic diagram illustrating the structure of a first color conversion block in some embodiments according to the present disclosure.

FIG. 7A is a schematic diagram illustrating the structure of a first color conversion block in some embodiments according to the present disclosure. Referring to FIG. 7A, the first color conversion block CCB1 is a color conversion block configured to convert a light of a third color (e.g., a blue light) into a light of a first color (e.g., a red light). In some embodiments, the first color conversion block CCB1 includes a first matrix MS1, a plurality of first scattering particles SP1 and a plurality of first quantum dots QD1 dispersed in the first matrix MS1. The first matrix MS1 may include a polymer material such as an organic polymer material. Examples of appropriate polymer materials for making the first matrix MS1 include epoxy resins, acrylic resins, polyurethane resins, silicone resins, and silane resins. Examples of appropriate materials for making the plurality of first scattering particles SP1 include $TiO_2$, ZnO, $ZrO_2$, $Al_2O_3$, $SiO_2$. Examples of appropriate quantum dots materials for making the plurality of first quantum dots QD1 include a quantum dots material of a first color (e.g., a red color). The quantum dots material may include a material selected from a group consisting of CdS, CdSe, ZnSe, InP, PbS, CsPbCl3, CsPbBr3, CsPhI3, CdS/ZnS, CdSe/ZnS, InP/ZnS. PbS/ZnS, CsPbCl3/ZnS, CsPbBr3/ZnS, and CsPhI3/ZnS.

Figure 7B:
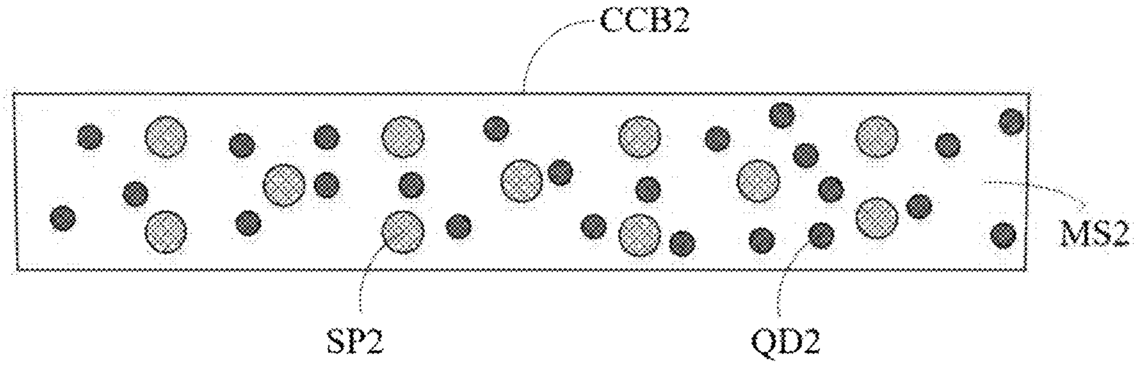
FIG. 7B is a schematic diagram illustrating the structure of a second color conversion block in some embodiments according to the present disclosure.

FIG. 7B is a schematic diagram illustrating the structure of a second color conversion block in some embodiments according to the present disclosure. Referring to FIG. 7B, the second color conversion block CCB2 is a color conversion block configured to convert a light of a third color (e.g., a blue light) into a light of a second color (e.g., a green light). In some embodiments, the second color conversion block CCB2 includes a second matrix MS2, a plurality of second scattering particles SP2 and a plurality of second quantum dots QD2 dispersed in the second matrix MS2. The second matrix MS2 may include a polymer material such as an organic polymer material. Examples of appropriate polymer materials for making the second matrix MS2 include epoxy resins, acrylic resins, polyurethane resins, silicone resins, and silane resins. Examples of appropriate materials for making the plurality of second scattering particles SP2 include $TiO_2$, ZnO, $ZrO_2$, $Al_2O_3$, $SiO_2$. Examples of appropriate quantum dots materials for making the plurality of second quantum dots QD2 include a quantum dots material of a second color (e.g., a green color). The quantum dots material may include a material selected from a group consisting of CdS, CdSe, ZnSe, InP, PbS, CsPbCl3, CsPbBr3, CsPhI3, CdS/ZnS, CdSe/ZnS, InP/ZnS, PbS/ZnS, CsPbCl3/ZnS, CsPbBr3/ZnS, and CsPhI3/ZnS.

Figure 7C:
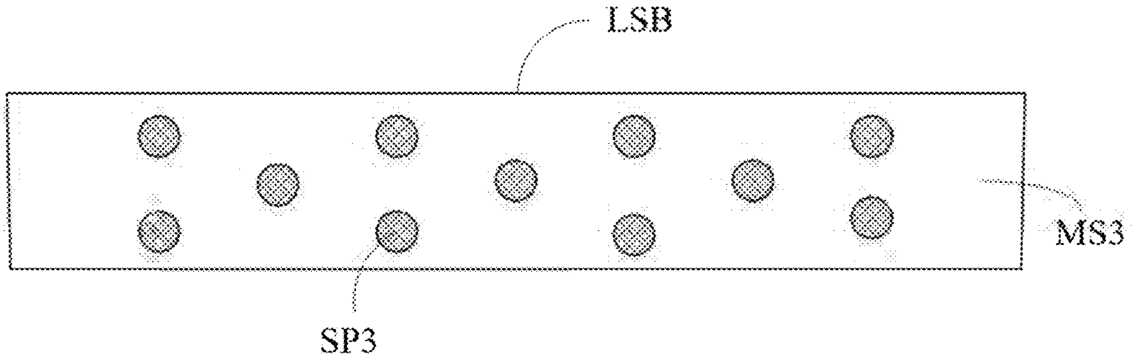
FIG. 7C is a schematic diagram illustrating the structure of a light scattering block in some embodiments according to the present disclosure.

FIG. 7C is a schematic diagram illustrating the structure of a light scattering block in some embodiments according to the present disclosure. Referring to FIG. 7C, the light scattering block LSB in some embodiments includes a third matrix MS3 and a plurality of third scattering particles SP3 dispersed in the third matrix MS3. The third matrix MS3 may include a polymer material such as an organic polymer material. Examples of appropriate polymer materials for making the third matrix MS3 include epoxy resins, acrylic resins, polyurethane resins, silicone resins, and silane resins. Examples of appropriate materials for making the plurality of third scattering particles SP3 include $TiO_2$, ZnO, $ZrO_2$, $Al_2O_3$, $SiO_2$.

In one example, the first matrix MS1, the second matrix MS2, and the third matrix MS3 includes a same polymer material. In another example, at least two of the first matrix MS1, the second matrix MS2, and the third matrix MS3 includes different polymer materials.

In one example, the first scattering particles SP1, the second scattering particles SP2, and the third scattering particles SP3 includes a same scattering material. In another example, at least two of the first scattering particles SP1, the second scattering particles SP2, and the third scattering particles SP3 includes different scattering materials.

Figure 8:
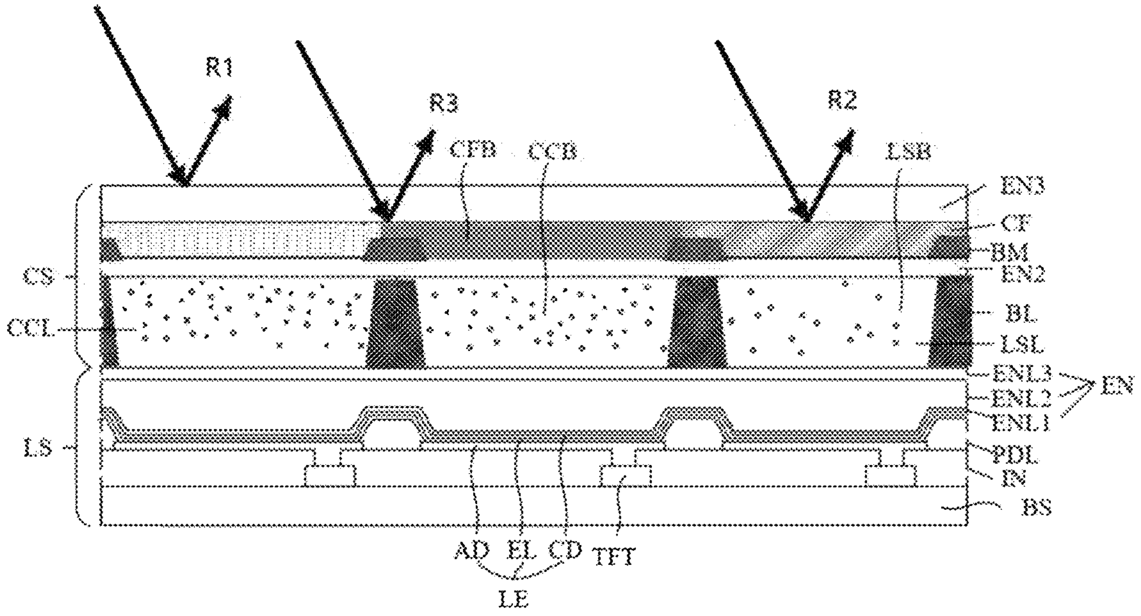
FIG. 8 illustrates reflection of ambient light by a display panel in some embodiments according to the present disclosure.

FIG. 8 illustrates reflection of ambient light by a display panel in some embodiments according to the present disclosure. Referring to FIG. 4 and FIG. 8, in some embodiments, the color filter CF is on a side of the black matrix BM away from the color conversion layer CCL and the light scattering layer LSL. Referring to FIG. 8, a first portion of the ambient light is reflected by the third encapsulating layer EN3, denoted as the first reflected light R1. A second portion of the ambient light is reflected by the color filter CF in the plurality of subpixel region, denoted as the second reflected light R2. A third portion of the ambient light is reflected by the color filter CF in the inter-subpixel region ISR, denoted as the third reflected light R3. The inventors of the present disclosure discover that, in display panels having the color filter CF on a side of the black matrix BM away from the color conversion layer CCL and the light scattering layer LSL, color separation occurs. Color separation refers to the occurrence of colored reflections of ambient light on the surface of the display panel, particularly noticeable when the display panel is turned off.

Figure 9:
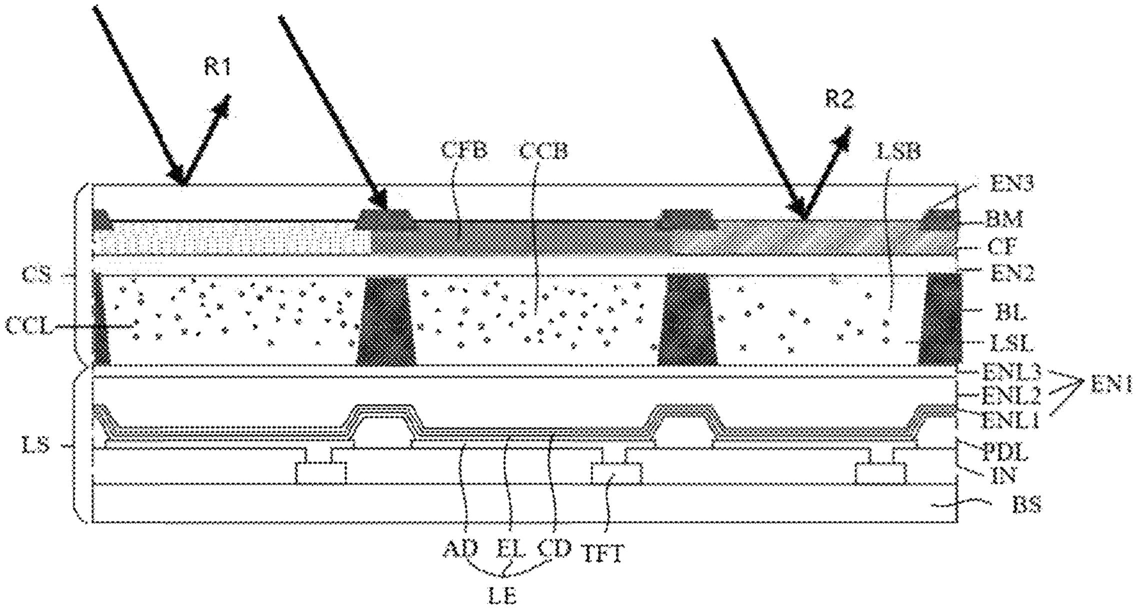
FIG. 9 illustrates reflection of ambient light by a display panel in some embodiments according to the present disclosure.

FIG. 9 illustrates reflection of ambient light by a display panel in some embodiments according to the present disclosure. Referring to FIG. 5 and FIG. 9, in some embodiments, the black matrix BM is on a side of the color filter CF away from the color conversion layer CCL and the light scattering layer LSL. Referring to FIG. 9, a first portion of the ambient light is reflected by the third encapsulating layer EN3, denoted as the first reflected light R1. A second portion of the ambient light is reflected by the color filter CF in the plurality of subpixel region, denoted as the second reflected light R2. Because the black matrix BM is on a side of the color filter CF away from the color conversion layer CCL and the light scattering layer LSL, a third portion of the ambient light is absorbed by the black matrix BM, thus eliminating the third reflected light R3. The inventors of the present disclosure discover that, in display panels having the black matrix BM on a side of the color filter CF away from the color conversion layer CCL and the light scattering layer LSL, color separation can be significantly reduced or eliminated.

Figure 10:
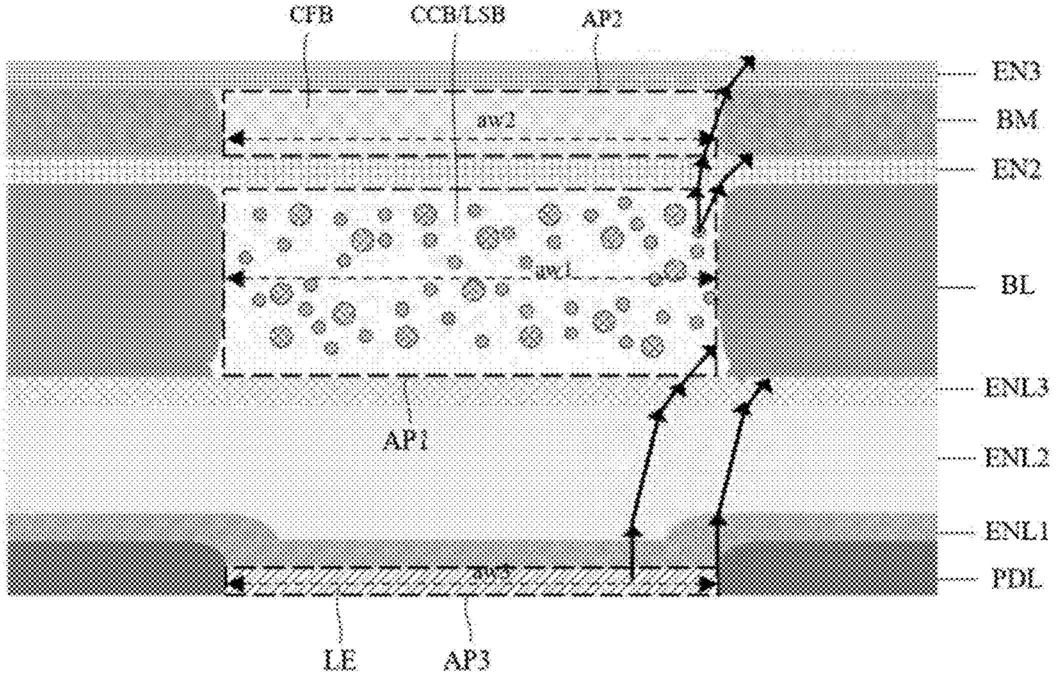
FIG. 10 is a schematic diagram illustrating a portion of a display panel in some embodiments according to the present disclosure.
Figure 11:
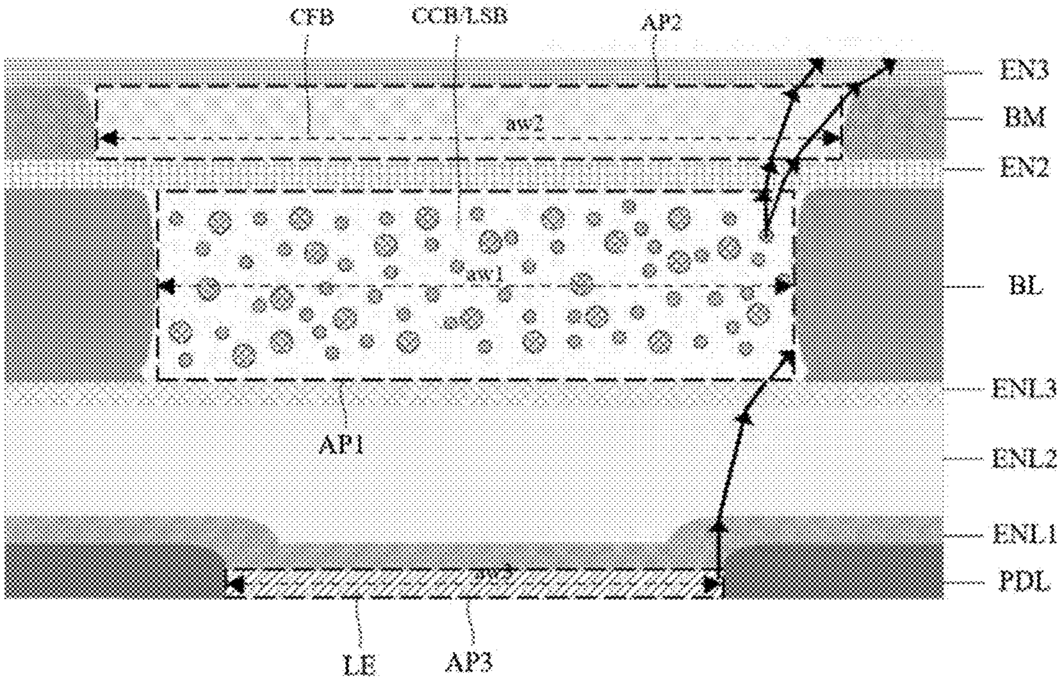
FIG. 11 is a schematic diagram illustrating a portion of a display panel in some embodiments according to the present disclosure.

FIG. 10 is a schematic diagram illustrating a portion of a display panel in some embodiments according to the present disclosure. FIG. 11 is a schematic diagram illustrating a portion of a display panel in some embodiments according to the present disclosure. Referring to FIG. 10 and FIG. 11, solid lines with arrows depict light extraction in the display panel. The display panel in some embodiments includes a plurality of first apertures AP1 extending through the bank layer BL, a respective color conversion block of the plurality of color conversion blocks CCB or a respective light scattering block of the plurality of light scattering blocks LSB at least partially in a respective first aperture of the plurality of first apertures AP1. In some embodiments, the display panel further includes a plurality of second apertures AP2 extending through the black matrix BM, a respective color filter block of the plurality of color filter blocks CFB at least partially in a respective second aperture of the plurality of second apertures AP2. In some embodiments, the display panel further includes a plurality of third apertures AP3 extending through the pixel definition layer PDL, a respective light emitting element of the plurality of light emitting elements LE (e.g., a light emitting layer of the respective light emitting element) at least partially in a respective third aperture of the plurality of third apertures AP3.

In some embodiments, a respective first aperture of the plurality of first apertures AP1 has a first aperture width aw1 along a plane intersecting the respective first aperture, a respective second aperture of the plurality of second apertures AP2, and a respective third aperture of the plurality of third apertures AP3, and perpendicular to a surface of a base substrate. In some embodiments, the respective second aperture has a second aperture width aw2 along the plane intersecting the respective first aperture, the respective second aperture, and the respective third aperture, and perpendicular to the surface of the base substrate. In some embodiments, the respective third aperture has a third aperture width aw3 along the plane intersecting the respective first aperture, the respective second aperture, and the respective third aperture, and perpendicular to the surface of the base substrate.

Referring to FIG. 10, in some embodiments, the first aperture width aw1, the second aperture width aw2, and the third aperture width aw3 are substantially the same. As used herein, the term "substantially the same" refers to a difference between two values not exceeding 10% of a base value (e.g., one of the two values), e.g., not exceeding 8%, not exceeding 6%, not exceeding 4%, not exceeding 2%, not exceeding 1%, not exceeding 0.5° not exceeding 0.1%, not exceeding 0.05%, and not exceeding 0.01%, of the base value.

Referring to FIG. 11, in some embodiments, the second aperture width aw2 is greater than the first aperture width aw1, and the first aperture width aw1 is greater than the third aperture width aw3. Optionally, the second aperture width aw2 is greater than the first aperture width aw1 by 10%, and the first aperture width aw1 is greater than the third aperture width aw3 by 10%. The inventors of the present disclosure discover that the relationship among the first aperture width aw1, the second aperture width aw2, and the third aperture width aw3 can affect the light extraction in the display panel, as shown in FIG. 10 and FIG. 11. As shown in FIG. 10, some light exiting the respective light emitting element is blocked or absorbed by the bank layer BL, and some light exiting the respective color conversion block is blocked or absorbed by the black matrix BM. As shown in FIG. 11, the light blockage or absorption by the bank layer BL or the black matrix BM is much reduced, enhancing light extraction efficiency and increasing viewing angle of the display panel.

In some embodiments, $1 \leq aw1/aw3 \leq 2$.

In some embodiments, $1 \leq aw2/aw1 \leq 1.5$.

Figure 12:
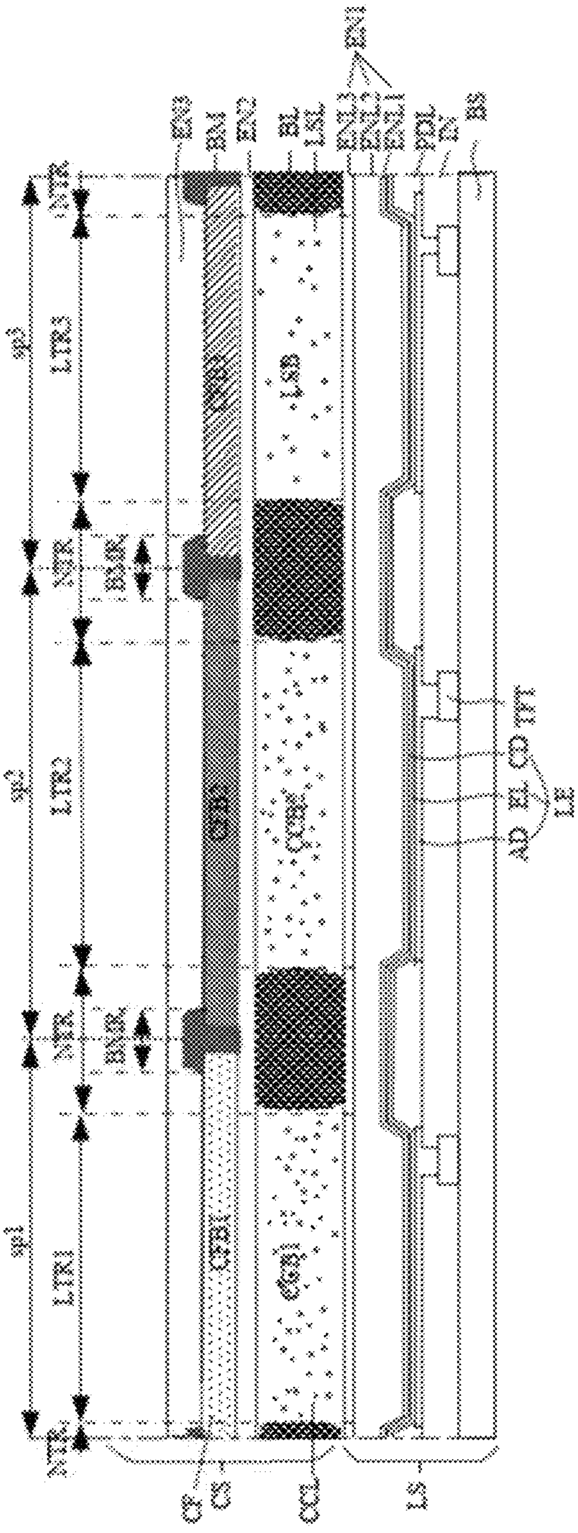
FIG. 12 is a schematic diagram illustrating the structure of a display panel in some embodiments according to the present disclosure.

FIG. 12 is a schematic diagram illustrating the structure of a display panel in some embodiments according to the present disclosure. Referring to FIG. 12, the display panel in some embodiments includes a first subpixel sp1, a second subpixel sp2, and a third subpixel sp3. In some embodiments, the display panel includes a first light transmissive region LTR1 in the first subpixel sp1, a second light transmissive region LTR2 in the second subpixel sp2, a third light transmissive region LTR3 in the third subpixel sp3, and a light non-transmissive region NTR. In some embodiments, the color conversion layer CCL includes a plurality of color conversion blocks including a first color conversion block CCB1 and a second color conversion block CCB2. The light scattering layer includes a plurality of light scattering blocks LSB. The first color conversion block CCB1 is at least partially in the first light transmissive region LTR1. The second color conversion block CCB2 is at least partially in the second light transmissive region LTR2. A respective light scatter block of the plurality of light scattering blocks LSB is at least partially in the third light transmissive region LTR3.

In some embodiments, the light non-transmissive region NTR includes a black matrix region BMR. In some embodiments, the display panel includes a bank layer BL in the light non-transmissive region NTR. In some embodiments, the display panel includes a black matrix BM in the black matrix region BMR.

Figure 13:
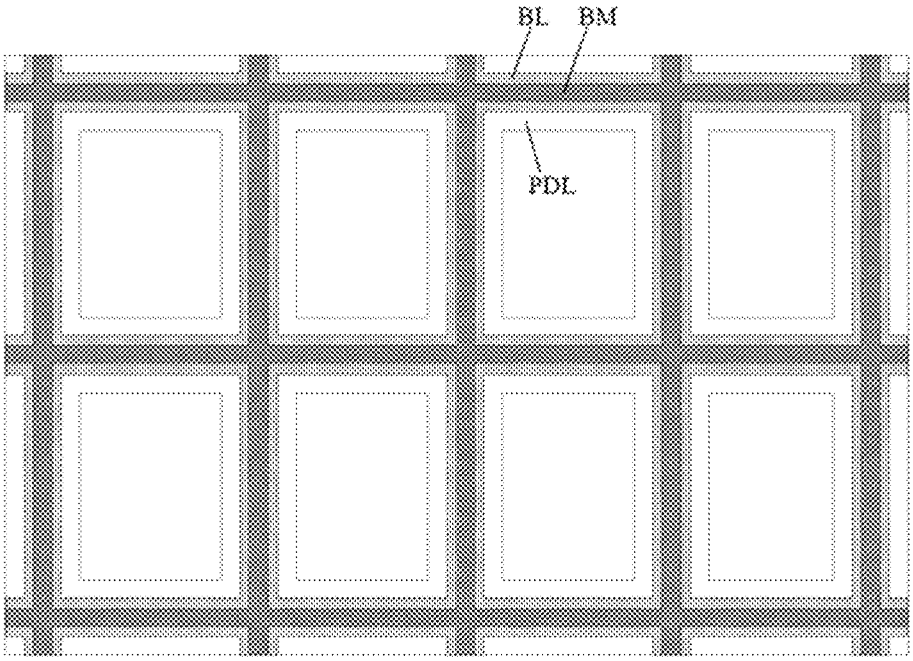
FIG. 13 is a plan view of a pixel definition layer, a bank layer, and a black matrix in a portion of a display panel in some embodiments according to the present disclosure.

FIG. 13 is a plan view of a pixel definition layer, a bank layer, and a black matrix in a portion of a display panel in some embodiments according to the present disclosure. Referring to FIG. 12 and FIG. 13, in some embodiments, an orthographic projection of the pixel definition layer PDL on a base substrate BS at least partially overlaps with an orthographic projection of the bank layer BL on the base substrate BS. In some embodiments, the orthographic projection of the pixel definition layer PDL on the base substrate BS substantially covers (e.g., covers at least 70%, covers at least 75%, covers at least 80%, covers at least 85% covers at least 90%, covers at least 95%, covers at least 99%, or completely covers) the orthographic projection of the bank layer BL on the base substrate BS.

In some embodiments, an orthographic projection of the pixel definition layer PDL on a base substrate BS at least partially overlaps with an orthographic projection of the black matrix BM on the base substrate BS. In some embodiments, the orthographic projection of the pixel definition layer PDL on the base substrate BS substantially covers (e.g., covers at least 70%, covers at least 75%, covers at least 80%, covers at least 85%, covers at least 90%, covers at least 95%, covers at least 99%, or completely covers) the orthographic projection of the black matrix BM on the base substrate BS.

In some embodiments, an orthographic projection of the bank layer BL on a base substrate BS at least partially overlaps with an orthographic projection of the black matrix BM on the base substrate BS. In some embodiments, the orthographic projection of the bank layer BL on the base substrate BS substantially covers (e.g., covers at least 70%, covers at least 75%, covers at least 80%, covers at least 85%, covers at least 90%, covers at least 95%, covers at least 99%, or completely covers) the orthographic projection of the black matrix BM on the base substrate BS.

Figure 14:
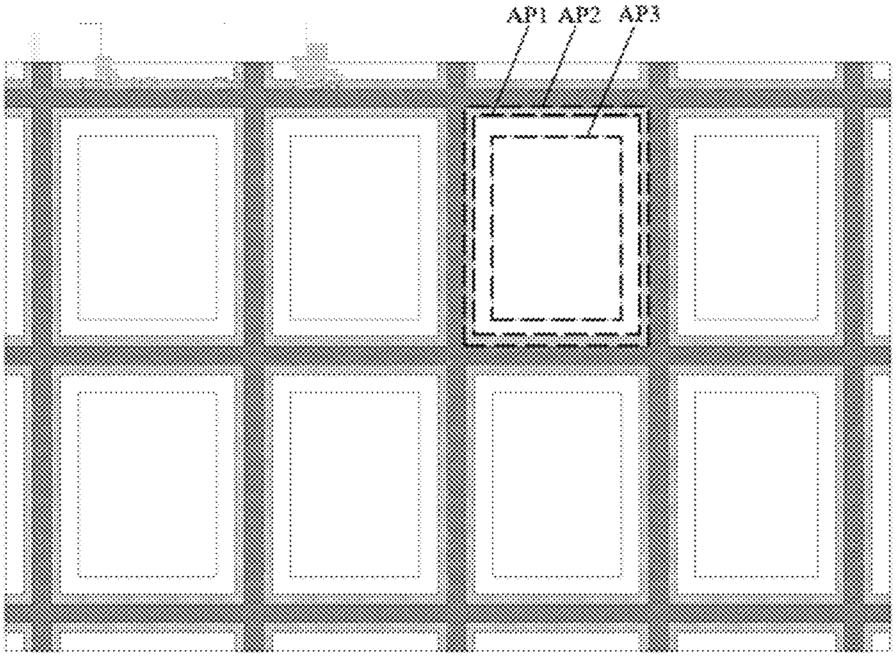
FIG. 14 is a plan view of a plurality of first apertures, a plurality of second apertures, and a plurality of third apertures in a portion of a display panel in some embodiments according to the present disclosure.

FIG. 14 is a plan view of a plurality of first apertures, a plurality of second apertures, and a plurality of third apertures in a portion of a display panel in some embodiments according to the present disclosure. Referring to FIG. 14, in some embodiments, an area of a respective second aperture of the plurality of second apertures AP2 is greater than an area of a respective first aperture of the plurality of first apertures AP1. In some embodiments, an area of a respective first aperture of the plurality of first apertures AP1 is greater than an area of a respective third aperture of the plurality of third apertures AP3.

In some embodiments, an orthographic projection of an edge of the respective second aperture on a base substrate substantially surrounds (e.g., surrounds at least 70% of, surrounds at least 75% of, surrounds at least 80% of, surrounds at least 85% of, surrounds at least 90% of, surrounds at least 95% of, surrounds at least 99% of, or completely surrounds) an orthographic projection of an edge of the respective first aperture on the base substrate.

In some embodiments, an orthographic projection of an edge of the respective second aperture on a base substrate substantially surrounds (e.g., surrounds at least 70% of, surrounds at least 75% of, surrounds at least 80% of, surrounds at least 85% of, surrounds at least 90% of, surrounds at least 95% of, surrounds at least 99% of, or completely surrounds) an orthographic projection of an edge of the respective third aperture on the base substrate.

In some embodiments, an orthographic projection of an edge of the respective first aperture on a base substrate substantially surrounds (e.g., surrounds at least 70% of, surrounds at least 75% of, surrounds at least 80% of, surrounds at least 85% of, surrounds at least 90% of, surrounds at least 95% of, surrounds at least 99% of, or completely surrounds) an orthographic projection of an edge of the respective third aperture on the base substrate.

Figure 15:
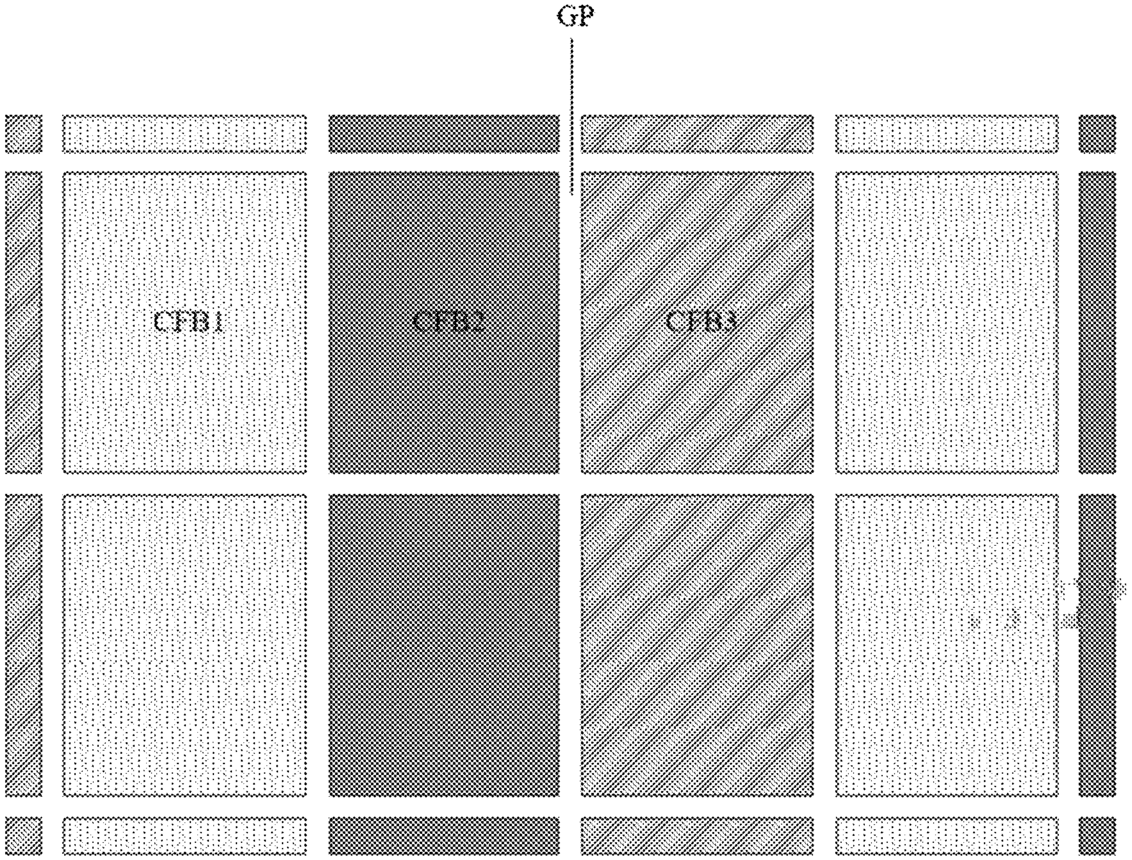
FIG. 15 is a plan view of a color filter in a portion of a display panel in some embodiments according to the present disclosure.

FIG. 15 is a plan view of a color filter in a portion of a display panel in some embodiments according to the present disclosure. Referring to FIG. 15, the display panel includes a gap GP extending at least partially into (e.g., extending through) the color filter, dividing the color filter into a plurality of color filter blocks including a first color filter block CFB1, a second color filter block CFB2, and a third color filter block CFB3. In some embodiments, referring to FIG. 12 and FIG. 15, the black matrix BM extends into the gap GP. In some embodiments, the black matrix BM is in direct contact with the second encapsulating layer EN2.

Figure 16A:
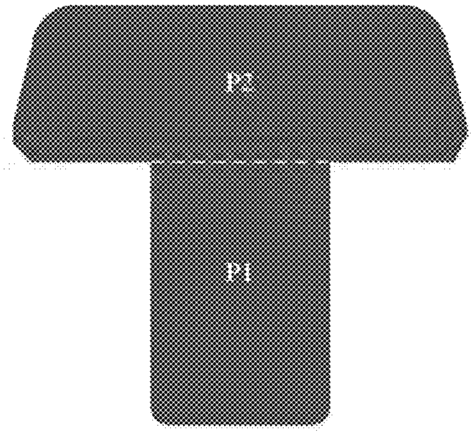
FIG. 16A is a cross-sectional view of a portion of a black matrix in a display panel in some embodiments according to the present disclosure.

FIG. 16A is a cross-sectional view of a portion of a black matrix in a display panel in some embodiments according to the present disclosure. Referring to FIG. 12, FIG. 15, and FIG. 16A, the black matrix BM in some embodiments includes a first portion P1 and a second portion P2 connected to each other. In some embodiments, the first portion P1 and the second portion P2 are parts of a unitary structure. In some embodiments, the first portion P1 is at least partially inside the gap GP, and the second portion P2 is at least partially outside the gap GP.

In some embodiments, the first portion P1 is in direct contact with the second encapsulating layer EN2.

In some embodiments, along a plane intersecting two adjacent subpixels and perpendicular to a surface of a base substrate, a cross-section of the first portion P1 has a rectangular shape or a substantially rectangular shape (e.g., with one or more snip corners). In some embodiments, along the plane intersecting two adjacent subpixels and perpendicular to a surface of the base substrate, a cross-section of the second portion P2 has a trapezoidal shape or a substantially trapezoidal shape (e.g., with one or more snip corners). In some embodiments, along the plane intersecting two adjacent subpixels and perpendicular to a surface of the base substrate, a minimum width of the second portion P2 is greater than a maximum width of the first portion P1.

Figure 16B:
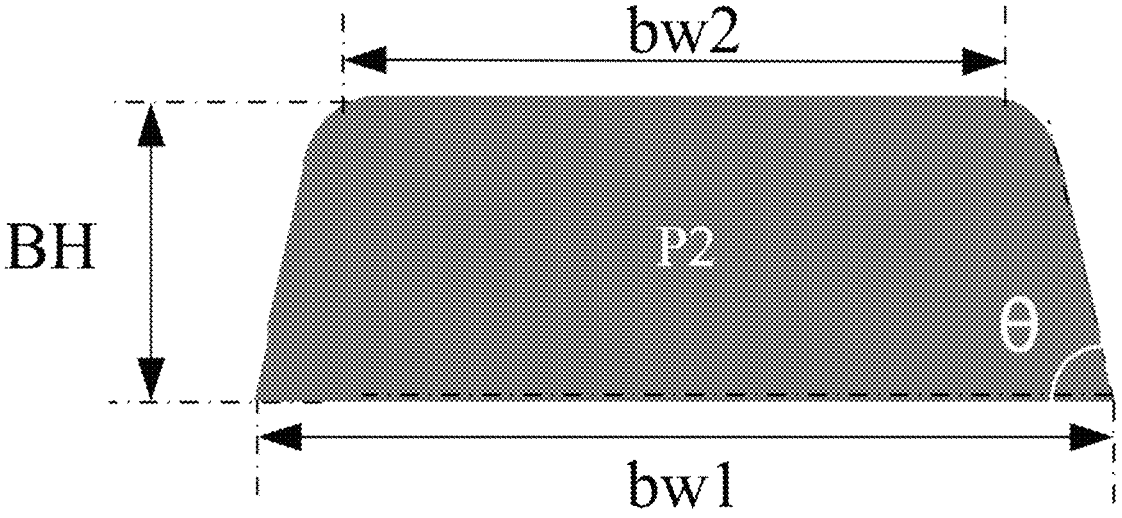
FIG. 16B is a cross-sectional view of a second portion of a black matrix in a display panel in some embodiments according to the present disclosure.

FIG. 16B is a cross-sectional view of a second portion of a black matrix in a display panel in some embodiments according to the present disclosure. Referring to FIG. 12 and FIG. 16B, in some embodiments, along the plane intersecting two adjacent subpixels and perpendicular to a surface of the base substrate, a cross-section of the second portion P2 of the black matrix BM in a light non-transmissive region NTR between two adjacent light transmissive regions has a trapezoidal shape or a substantially trapezoidal shape (e.g., with one or more snip corners).

In some embodiments, along the plane intersecting two adjacent subpixels and perpendicular to a surface of the base substrate, the cross-section of the second portion P2 of the black matrix BM in a light non-transmissive region NTR between two adjacent light transmissive regions has a first base having a first base width bw1 and a second base having a second base width bw2, the first base and the second base being opposite to each other. Optionally, the second base is on a side of the first base away from the base substrate BS. The first base width bw1 is greater than the second base width bw2. In some embodiments, along the plane intersecting two adjacent subpixels and perpendicular to a surface of the base substrate, the second portion P2 of the black matrix BM in a light non-transmissive region NTR between two adjacent light transmissive regions has a thickness BH. In some embodiments, the cross-section of the second portion P2 of the black matrix BM in a light non-transmissive region NTR between two adjacent light transmissive regions has a first base angle θ. The first base angle θ is an included angle between the first base and a leg of the portion of the black matrix BM in a light non-transmissive region NTR between two adjacent light transmissive regions.

In some embodiments, $1 \leq bw1/BH \leq 4$.

In some embodiments, $0.75 \leq bw2/bw1 \leq 1$.

In some embodiments, 60 degrees≤θ≤90 degrees.

In one particular example, 1 μm≤BH≤3 μm.

Figure 16C:
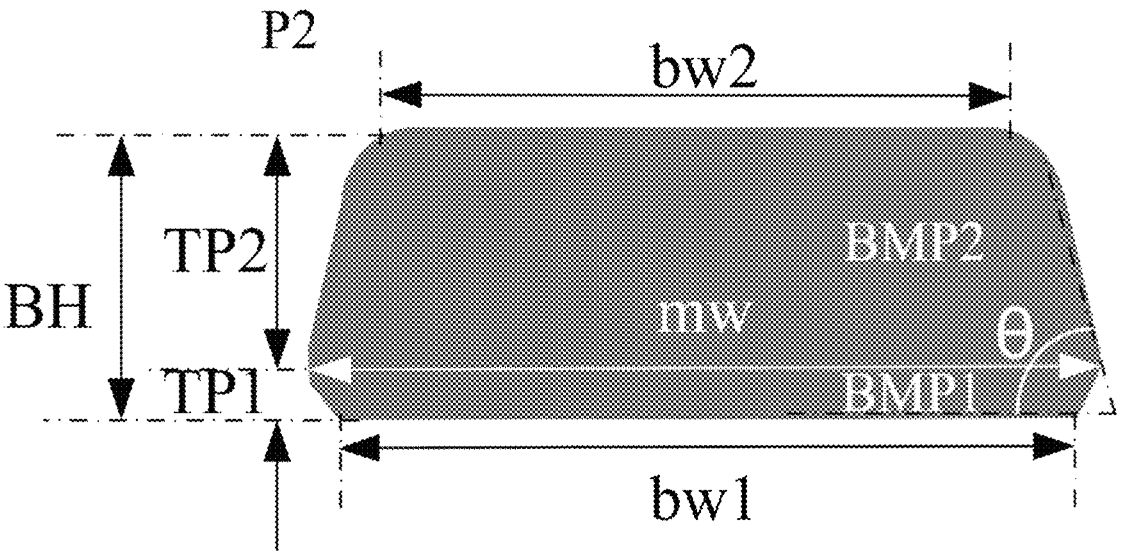
FIG. 16C is a cross-sectional view of a second portion of a black matrix in a display panel in some embodiments according to the present disclosure.

FIG. 16C is a cross-sectional view of a second portion of a black matrix in a display panel in some embodiments according to the present disclosure. Referring to FIG. 12 and FIG. 16C, in some embodiments, along the plane intersecting two adjacent subpixels and perpendicular to a surface of the base substrate, a cross-section of the second portion P2 of the black matrix BM in a light non-transmissive region NTR between two adjacent light transmissive regions has a trapezoidal shape or a substantially trapezoidal shape (e.g., with one or more snip corners).

In some embodiments, along the plane intersecting two adjacent subpixels and perpendicular to a surface of the base substrate, the cross-section of the second portion P2 of the black matrix BM in a light non-transmissive region NTR between two adjacent light transmissive regions has a varying width along a direction from a respective light emitting element to a respective color filter block configured to receive light emitted from the respective light emitting element.

In some embodiments, along the plane intersecting two adjacent subpixels and perpendicular to a surface of the base substrate, a width of the cross-section of the second portion P2 of the black matrix BM in a light non-transmissive region NTR between two adjacent light transmissive regions transitions from a first base width bw1, to a maximum width mw, and to a second base width bw2, along the direction from a respective light emitting element to a respective color filter block configured to receive light emitted from the respective light emitting element.

In some embodiments, 1≤mw/BH≤4.

In some embodiments, 0.75≤bw2/mw≤1.

In some embodiments, 0.75≤bw1/mw≤1.

In some embodiments, 60 degrees≤θ≤90 degrees.

In one particular example, 1 μm≤BH≤3 μm.

In some embodiments, the second portion P2 of the black matrix BM includes a first black matrix portion BMP1 and a second black matrix portion BMP2 on a side of the first black matrix portion BMP1 away from the base substrate. In some embodiments, along the plane intersecting two adjacent subpixels and perpendicular to a surface of a base substrate, a cross-section of the first black matrix portion BMP1 of the second portion P2 in a light non-transmissive region NTR between two adjacent light transmissive regions has a first side having the first base width bw1 and a second side having the maximum width mw, the second side being opposite to the first side. In some embodiments, along the plane intersecting two adjacent subpixels and perpendicular to a surface of a base substrate, a cross-section of the second black matrix portion BMP2 of the second portion P2 in a light non-transmissive region NTR between two adjacent light transmissive regions has a third side having the maximum width mw and a fourth side having the second base width bw2, the fourth side being opposite to the third side. Optionally, the first black matrix portion BMP1 and the second black matrix portion BMP2 are parts of a unitary structure. Optionally, the first black matrix portion BMP1, the second black matrix portion BMP2, and the first portion P1 are parts of a unitary structure. Optionally, the first black matrix portion BMP1 has a substantially inverted trapezoidal shape, and the second black matrix portion BMP2 has a substantially trapezoidal shape. Optionally, the substantially inverted trapezoidal shape and the substantially trapezoidal shape share a longer base.

In some embodiments, along the plane intersecting two adjacent subpixels and perpendicular to a surface of the base substrate, the second portion P2 of the black matrix BM in a light non-transmissive region NTR between two adjacent light transmissive regions has a thickness BH. In some embodiments, along the plane intersecting two adjacent subpixels and perpendicular to a surface of the base substrate, the first black matrix portion BMP1 of second portion P2 in a light non-transmissive region NTR between two adjacent light transmissive regions has a first portion thickness TP1. In some embodiments, along the plane intersecting two adjacent subpixels and perpendicular to a surface of the base substrate, the second black matrix portion BMP2 of the second portion P2 in a light non-transmissive region NTR between two adjacent light transmissive regions has a second portion thickness TP2. The first base angle θ is an included angle between the first base and a leg of the second black matrix portion BMP2.

In some embodiments, TP1+TP2=BH.

In some embodiments, 1≤mw/BH≤4.

In some embodiments, 0.75≤bw2/mw≤1.

In some embodiments, 0.75≤bw1/mw≤1.

In some embodiments, 60 degrees≤θ≤90 degrees.

In one particular example, 1 μm≤BH≤3 μm.

Figure 17:
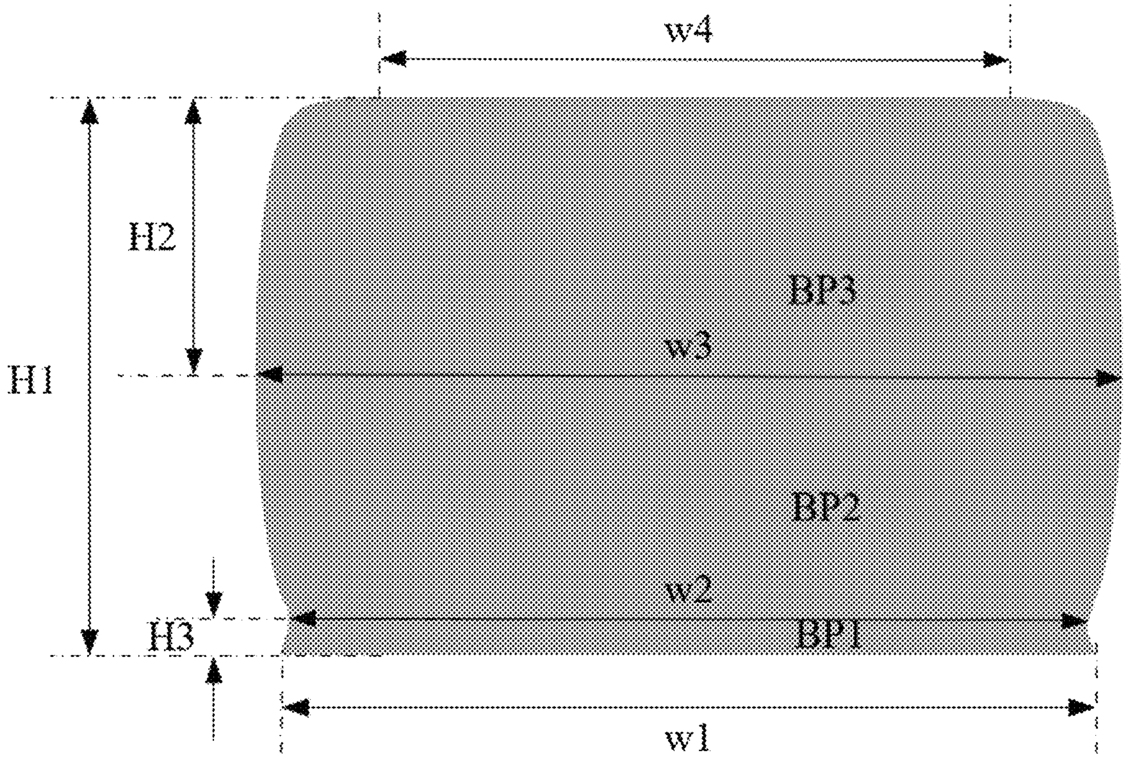
FIG. 17 is a cross-sectional view of a portion of a bank layer in a display panel in some embodiments according to the present disclosure.

FIG. 17 is a cross-sectional view of a portion of a bank layer in a display panel in some embodiments according to the present disclosure. Referring to FIG. 12 and FIG. 17, along a plane intersecting two adjacent subpixels and perpendicular to a surface of a base substrate, a cross-section of a portion of the bank layer BL between two adjacent color conversion blocks or between a color conversion block and a light scattering block adjacent to each other has a varying width along a direction from a respective light emitting element to a respective color filter block configured to receive light emitted from the respective light emitting element.

In some embodiments, along the plane intersecting two adjacent subpixels and perpendicular to a surface of a base substrate, a width of the cross-section transitions from a first width w1, to a second width w2, to a third width w3, and to a fourth width w4, along the direction from a respective light emitting element to a respective color filter block configured to receive light emitted from the respective light emitting element.

In some embodiments, w2≤w1≤w3. Optionally, w4≤w2≤w1≤w3.

In some embodiments, (w3−w2)/w3≤0.1.

In some embodiments, the bank layer BL includes a first bank portion BP1, a second bank portion BP2 on the first bank portion BP1, and a third bank portion BP3 on a side of the second bank portion BP2 away from the first bank portion BP1. In some embodiments, along the plane intersecting two adjacent subpixels and perpendicular to a surface of a base substrate, a cross-section of the first bank portion BP1 between two adjacent color conversion blocks or between a color conversion block and a light scattering block adjacent to each other has a first side having the first width w1 and a second side having the second width w2, the second side being opposite to the first side. In some embodiments, along the plane intersecting two adjacent subpixels and perpendicular to a surface of a base substrate, a cross-section of the second bank portion BP2 between two adjacent color conversion blocks or between a color conversion block and a light scattering block adjacent to each other has a third side having the second width w2 and a fourth side having the third width w3, the fourth side being opposite to the third side. In some embodiments, along the plane intersecting two adjacent subpixels and perpendicular to a surface of a base substrate, a cross-section of the third bank portion BP3 between two adjacent color conversion blocks or between a color conversion block and a light scattering block adjacent to each other has a fifth side having the third width w3 and a sixth side having the fourth width w4, the sixth side being opposite to the fifth side. Optionally, the first bank portion BP1, the second bank portion BP2, and the third bank portion BP3 are parts of a unitary structure.

In some embodiments, $w2 \leq w1 \leq w3$. Optionally, $w4 \leq w2 \leq w1 \leq w3$.

In some embodiments, $(w3-w2)/w3 \leq 0.1$.

In some embodiments, along the plane intersecting two adjacent subpixels and perpendicular to a surface of a base substrate, the portion of the bank layer BL between two adjacent color conversion blocks or between a color conversion block and a light scattering block adjacent to each other has a first thickness H1. In some embodiments, along the plane intersecting two adjacent subpixels and perpendicular to a surface of a base substrate, the third bank portion BP3 between two adjacent color conversion blocks or between a color conversion block and a light scattering block adjacent to each other has a second thickness H2. In some embodiments, along the plane intersecting two adjacent subpixels and perpendicular to a surface of a base substrate, the first bank portion BP1 between two adjacent color conversion blocks or between a color conversion block and a light scattering block adjacent to each other has a third thickness H3.

In some embodiments, $1 \leq w3/H1 \leq 2$.

In some embodiments, $H2+H3<H1$.

In some embodiments, $0.3 \leq H2/H1 \leq 0.7$;

In some embodiments, $H3/H1 \leq 0.2$.

In one particular example, 10 μm≤H1≤15 μm.

In one particular example, the bank layer BL includes a negative photoresist material.

Figure 18:
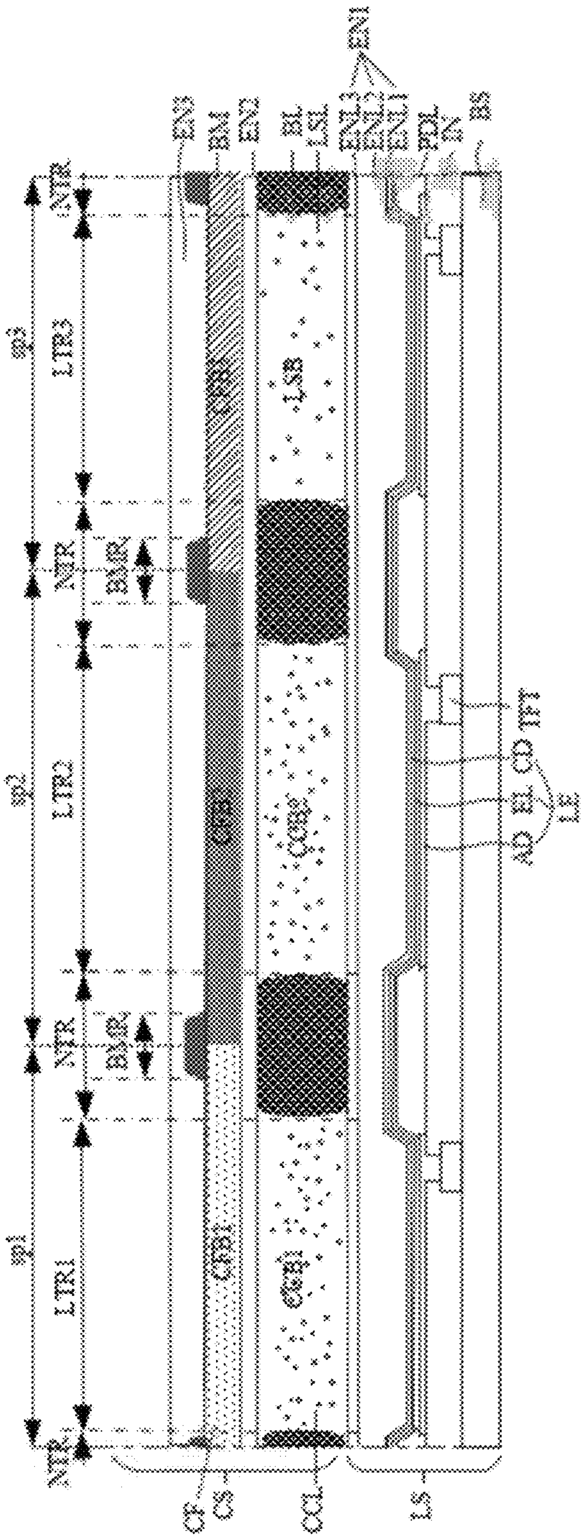
FIG. 18 is a schematic diagram illustrating the structure of a display panel in some embodiments according to the present disclosure.

FIG. 18 is a schematic diagram illustrating the structure of a display panel in some embodiments according to the present disclosure. Referring to FIG. 18, in some embodiments, the black matrix BM is on a side of the color filter CF away from the base substrate BS. In some embodiments, the color filter CF spaces apart the black matrix BM from the second encapsulating layer EN2. In some embodiments, the black matrix BM is not in direct contact with the second encapsulating layer EN2. In some embodiments, in a light non-transmissive region NTR between two adjacent light transmissive regions, a portion of the black matrix BM is in direct contact with two adjacent color filter blocks, e.g., two adjacent color filter blocks of different colors. In one example, in a light non-transmissive region NTR between a first light transmissive region LTR1 and a second light transmissive region LTR2, a portion of the black matrix BM is in direct contact with the first color filter block CFB1 and the second color filter block CFB2. In another example, the in a light non-transmissive region NTR between a second light transmissive region LTR2 and a third light transmissive region LTR3, a portion of the black matrix BM is in direct contact with the second color filter block CFB2 and the third color filter block CFB3.

Figure 19:
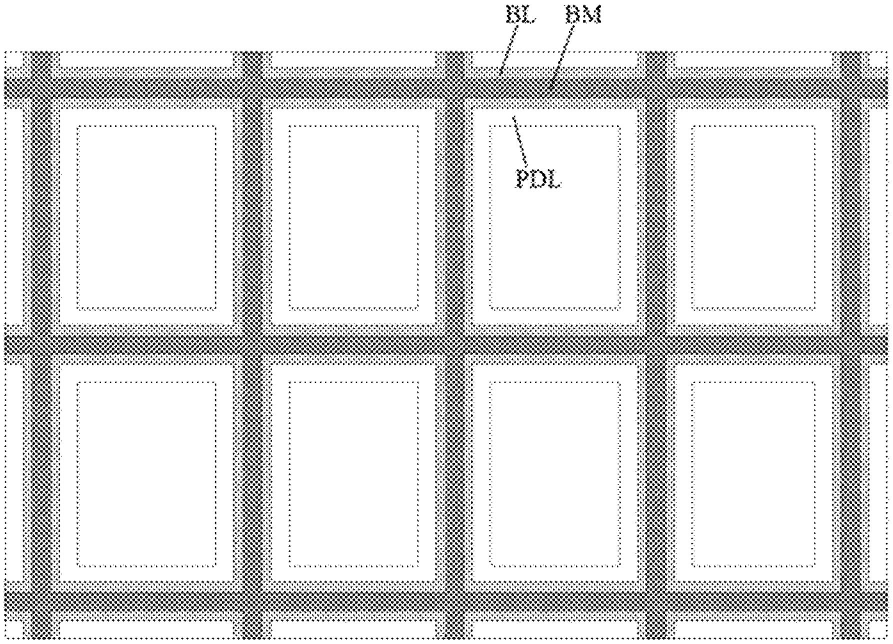
FIG. 19 is a plan view of a pixel definition layer, a bank layer, and a black matrix in a portion of a display panel in some embodiments according to the present disclosure.

FIG. 19 is a plan view of a pixel definition layer, a bank layer, and a black matrix in a portion of a display panel in some embodiments according to the present disclosure. Referring to FIG. 18 and FIG. 19, in some embodiments, an orthographic projection of the pixel definition layer PDL on a base substrate BS at least partially overlaps with an orthographic projection of the bank layer BL on the base substrate BS. In some embodiments, the orthographic projection of the pixel definition layer PDL on the base substrate BS substantially covers (e.g., covers at least 70%, covers at least 75%, covers at least 80%, covers at least 85%, covers at least 90%, covers at least 95%, covers at least 99%, or completely covers) the orthographic projection of the bank layer BL on the base substrate BS.

In some embodiments, an orthographic projection of the pixel definition layer PDL on a base substrate BS at least partially overlaps with an orthographic projection of the black matrix BM on the base substrate BS. In some embodiments, the orthographic projection of the pixel definition layer PDL on the base substrate BS substantially covers (e.g., covers at least 70%, covers at least 75%, covers at least 80%, covers at least 85%, covers at least 90%, covers at least 95%, covers at least 99%, or completely covers) the orthographic projection of the black matrix BM on the base substrate BS.

In some embodiments, an orthographic projection of the bank layer BL on a base substrate BS at least partially overlaps with an orthographic projection of the black matrix BM on the base substrate BS. In some embodiments, the orthographic projection of the bank layer BL on the base substrate BS substantially covers (e.g., covers at least 70%, covers at least 75%, covers at least 80%, covers at least 85%, covers at least 90%, covers at least 95%, covers at least 99%, or completely covers) the orthographic projection of the black matrix BM on the base substrate BS.

Figure 20:
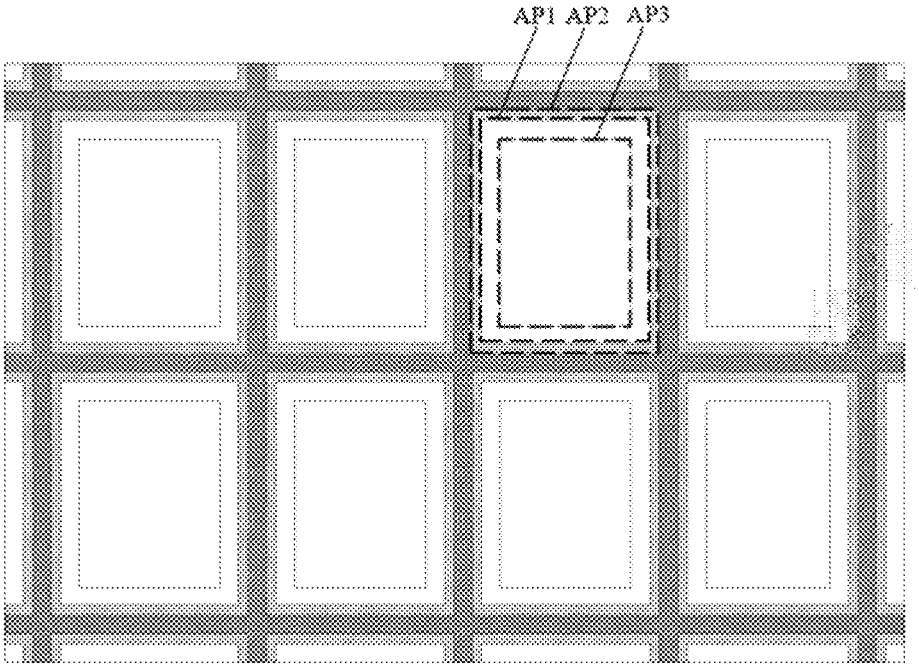
FIG. 20 is a plan view of a plurality of first apertures, a plurality of second apertures, and a plurality of third apertures in a portion of a display panel in some embodiments according to the present disclosure.

FIG. 20 is a plan view of a plurality of first apertures, a plurality of second apertures, and a plurality of third apertures in a portion of a display panel in some embodiments according to the present disclosure. Referring to FIG. 20, in some embodiments, an area of a respective second aperture of the plurality of second apertures AP2 is greater than an area of a respective first aperture of the plurality of first apertures AP1. In some embodiments, an area of a respective first aperture of the plurality of first apertures AP1 is greater than an area of a respective third aperture of the plurality of third apertures AP3.

In some embodiments, an orthographic projection of an edge of the respective second aperture on a base substrate substantially surrounds (e.g., surrounds at least 70% of, surrounds at least 75% of, surrounds at least 80% of, surrounds at least 85% of, surrounds at least 90% of, surrounds at least 95% of, surrounds at least 99% of, or completely surrounds) an orthographic projection of an edge of the respective first aperture on the base substrate.

In some embodiments, an orthographic projection of an edge of the respective second aperture on a base substrate substantially surrounds (e.g., surrounds at least 70% of, surrounds at least 75% of, surrounds at least 80% of, surrounds at least 85% of, surrounds at least 90% of, surrounds at least 95% of, surrounds at least 99% of, or completely surrounds) an orthographic projection of an edge of the respective third aperture on the base substrate.

In some embodiments, an orthographic projection of an edge of the respective first aperture on a base substrate substantially surrounds (e.g., surrounds at least 70% of, surrounds at least 75% of, surrounds at least 80% of, surrounds at least 85% of, surrounds at least 90% of, surrounds at least 95% of, surrounds at least 99% of, or completely surrounds) an orthographic projection of an edge of the respective third aperture on the base substrate.

Figure 21:
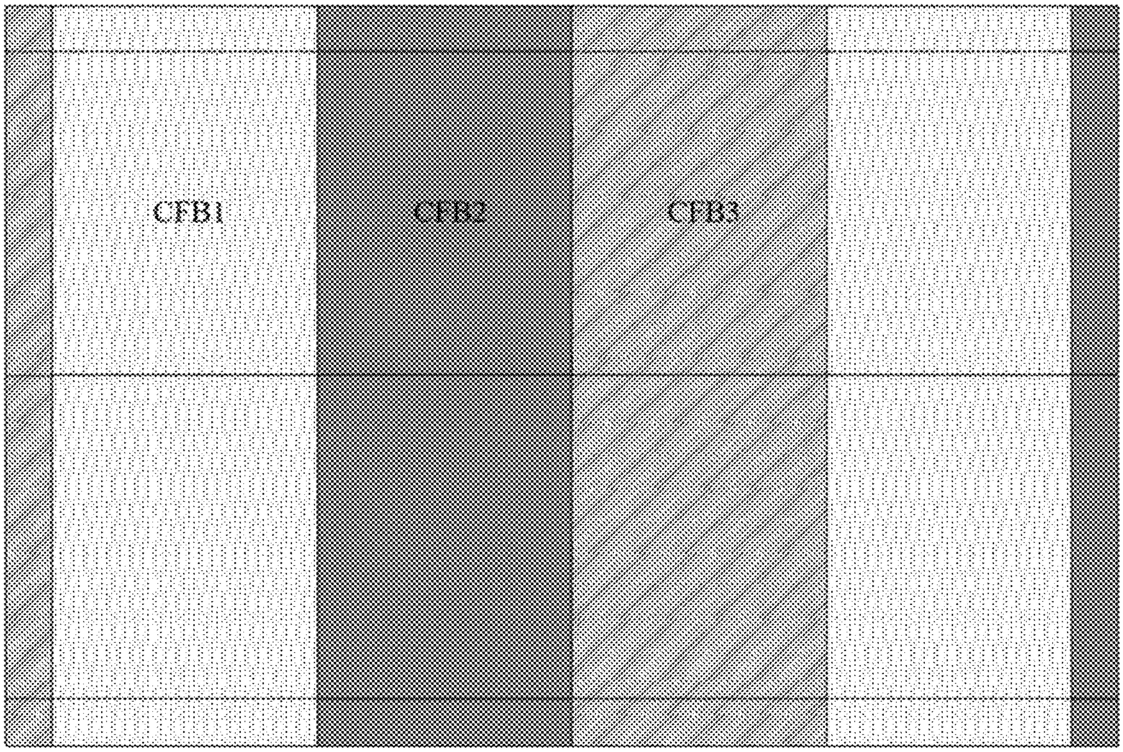
FIG. 21 is a plan view of a color filter in a portion of a display panel in some embodiments according to the present disclosure.

FIG. 21 is a plan view of a color filter in a portion of a display panel in some embodiments according to the present disclosure. Referring to FIG. 21, the display panel in some embodiments does not include a gap extending into the color filter. In some embodiments, adjacent color filter blocks of the color filter are in contact with each other. The plurality of color filter blocks form a continuous surface supporting the black matrix.

Figure 22:
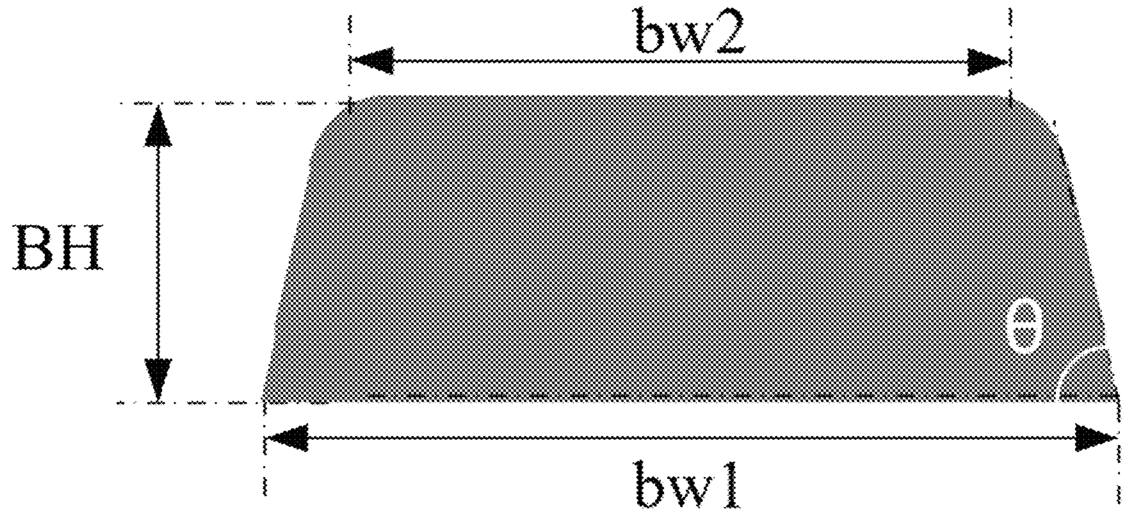
FIG. 22 is a cross-sectional view of a portion of a black matrix in a display panel in some embodiments according to the present disclosure.

FIG. 22 is a cross-sectional view of a portion of a black matrix in a display panel in some embodiments according to the present disclosure. Referring to FIG. 22, in some embodiments, along the plane intersecting two adjacent subpixels and perpendicular to a surface of the base substrate, a cross-section of the portion of the black matrix BM in a light non-transmissive region NTR between two adjacent light transmissive regions has a trapezoidal shape or a substantially trapezoidal shape (e.g., with one or more snip corners).

In some embodiments, along the plane intersecting two adjacent subpixels and perpendicular to a surface of the base substrate, the cross-section of the portion of the black matrix BM in a light non-transmissive region NTR between two adjacent light transmissive regions has a first base having a first base width bw1 and a second base having a second base width bw2, the first base and the second base being opposite to each other. Optionally, the second base is on a side of the first base away from the base substrate BS. The first base width bw1 is greater than the second base width bw2. In some embodiments, along the plane intersecting two adjacent subpixels and perpendicular to a surface of the base substrate, the portion of the black matrix BM in a light non-transmissive region NTR between two adjacent light transmissive regions has a thickness BH. In some embodiments, the cross-section of the portion of the black matrix BM in a light non-transmissive region NTR between two adjacent light transmissive regions has a first base angle θ. The first base angle θ is an included angle between the first base and a leg of the portion of the black matrix BM in a light non-transmissive region NTR between two adjacent light transmissive regions.

In some embodiments, 1≤bw1/BH≤4.

In some embodiments, 0.75≤bw2/bw1≤1.

In some embodiments, 60 degrees≤θ≤90 degrees.

In one particular example, 1 μm≤BH≤3 μm.

Figure 23:
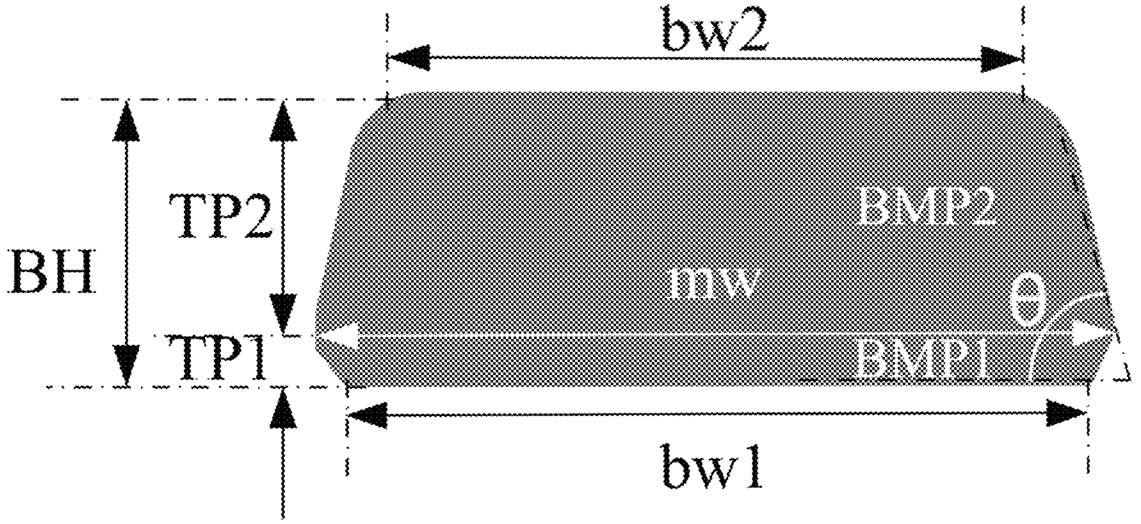
FIG. 23 is a cross-sectional view of a portion of a black matrix in a display panel in some embodiments according to the present disclosure.

FIG. 23 is a cross-sectional view of a portion of a black matrix in a display panel in some embodiments according to the present disclosure. Referring to FIG. 23, in some embodiments, along the plane intersecting two adjacent subpixels and perpendicular to a surface of the base substrate, a cross-section of the portion of the black matrix BM in a light non-transmissive region NTR between two adjacent light transmissive regions has a trapezoidal shape or a substantially trapezoidal shape (e.g., with one or more snip corners).

In some embodiments, along the plane intersecting two adjacent subpixels and perpendicular to a surface of the base substrate, the cross-section of the portion of the black matrix BM in a light non-transmissive region NTR between two adjacent light transmissive regions has a varying width along a direction from a respective light emitting element to a respective color filter block configured to receive light emitted from the respective light emitting element.

In some embodiments, along the plane intersecting two adjacent subpixels and perpendicular to a surface of the base substrate, a width of the cross-section of the portion of the black matrix BM in a light non-transmissive region NTR between two adjacent light transmissive regions transitions from a first base width bw1, to a maximum width mw, and to a second base width bw2, along the direction from a respective light emitting element to a respective color filter block configured to receive light emitted from the respective light emitting element.

In some embodiments, 1≤mw/BH≤4.

In some embodiments, 0.75≤bw2/mw≤1.

In some embodiments, 0.75≤bw1/mw≤1.

In some embodiments, 60 degrees≤θ≤90 degrees.

In one particular example, 1 μm≤BH≤3 μm.

In some embodiments, the black matrix BM includes a first black matrix portion BMP1 and a second black matrix portion BMP2 on a side of the first black matrix portion BMP1 away from the base substrate. In some embodiments, along the plane intersecting two adjacent subpixels and perpendicular to a surface of a base substrate, a cross-section of the first black matrix portion BMP1 in a light non-transmissive region NTR between two adjacent light transmissive regions has a first side having the first base width bw1 and a second side having the maximum width mw, the second side being opposite to the first side. In some embodiments, along the plane intersecting two adjacent subpixels and perpendicular to a surface of a base substrate, a cross-section of the second black matrix portion BMP2 in a light non-transmissive region NTR between two adjacent light transmissive regions has a third side having the maximum width mw and a fourth side having the second base width bw2, the fourth side being opposite to the third side. Optionally, the first black matrix portion BMP1 and the second black matrix portion BMP2 are parts of a unitary structure. Optionally, the first black matrix portion BMP1 has a substantially inverted trapezoidal shape, and the second black matrix portion BMP2 has a substantially trapezoidal shape. Optionally, the substantially inverted trapezoidal shape and the substantially trapezoidal shape share a longer base.

In some embodiments, along the plane intersecting two adjacent subpixels and perpendicular to a surface of the base substrate, the portion of the black matrix BM in a light non-transmissive region NTR between two adjacent light transmissive regions has a thickness BH. In some embodiments, along the plane intersecting two adjacent subpixels and perpendicular to a surface of the base substrate, the first black matrix portion BMP1 in a light non-transmissive region NTR between two adjacent light transmissive regions has a first portion thickness TP1. In some embodiments, along the plane intersecting two adjacent subpixels and perpendicular to a surface of the base substrate, the second black matrix portion BMP2 in a light non-transmissive region NTR between two adjacent light transmissive regions has a second portion thickness TP2. The first base angle θ is an included angle between the first base and a leg of the second black matrix portion BMP2.

In some embodiments, TP1+TP2=BH.

In some embodiments, 1≤mw/BH≤4.

In some embodiments, 0.75≤bw2/mw≤1.

In some embodiments, 0.75≤bw1/mw≤1.

In some embodiments, 60 degrees≤θ≤90 degrees.

In one particular example, 1 μm≤BH≤3 μm.

Figure 24:
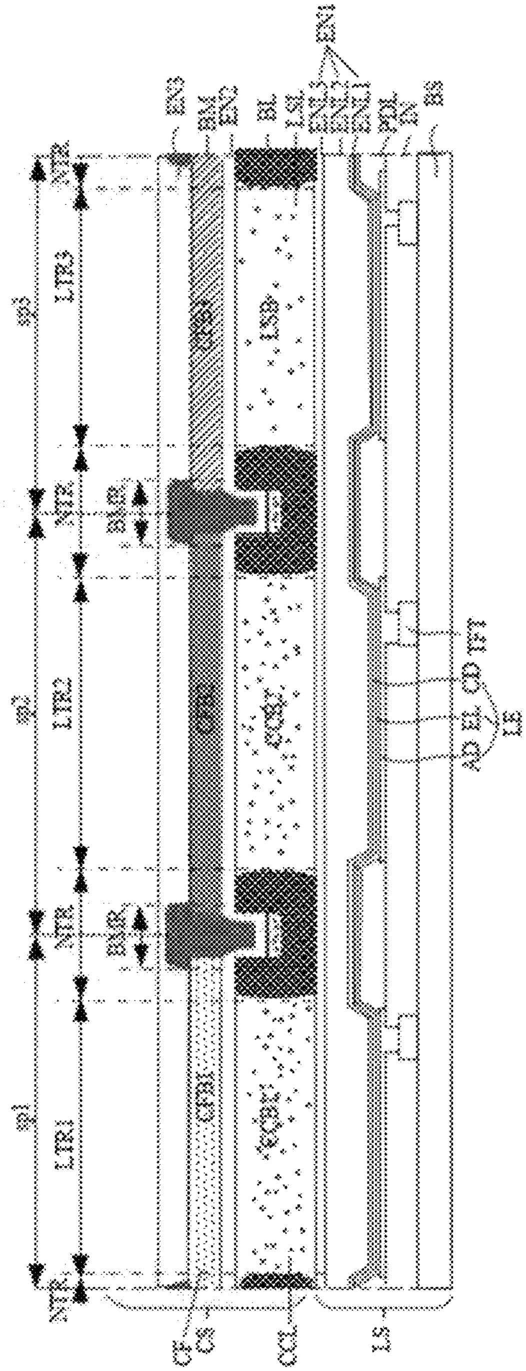
FIG. 24 is a schematic diagram illustrating the structure of a display panel in some embodiments according to the present disclosure.
Figure 25:
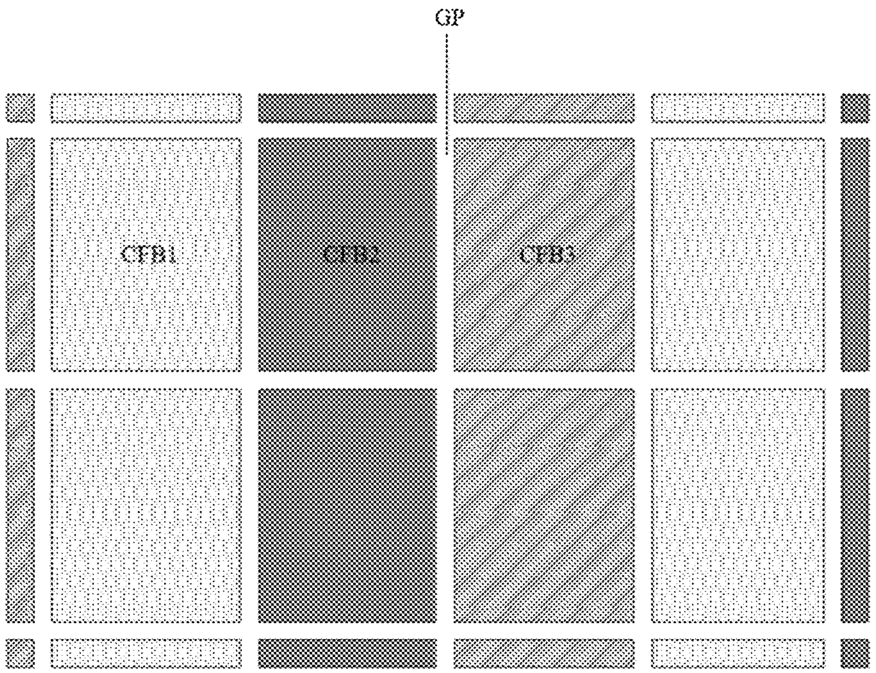
FIG. 25 is a plan view of a color filter in a portion of a display panel in some embodiments according to the present disclosure.

FIG. 24 is a schematic diagram illustrating the structure of a display panel in some embodiments according to the present disclosure. FIG. 25 is a plan view of a color filter in a portion of a display panel in some embodiments according to the present disclosure, Referring to FIG. 24 and FIG. 25, the display panel includes a gap GP extending at least partially into (e.g., extending through) the color filter CF, dividing the color filter CF into a plurality of color filter blocks including a first color filter block CFB1, a second color filter block CFB2, and a third color filter block CFB3. In some embodiments, referring to FIG. 24 and FIG. 25, the black matrix BM extends into the gap GP. In some embodiments, the black matrix BM is in direct contact with the second encapsulating layer EN2.

Figure 26:
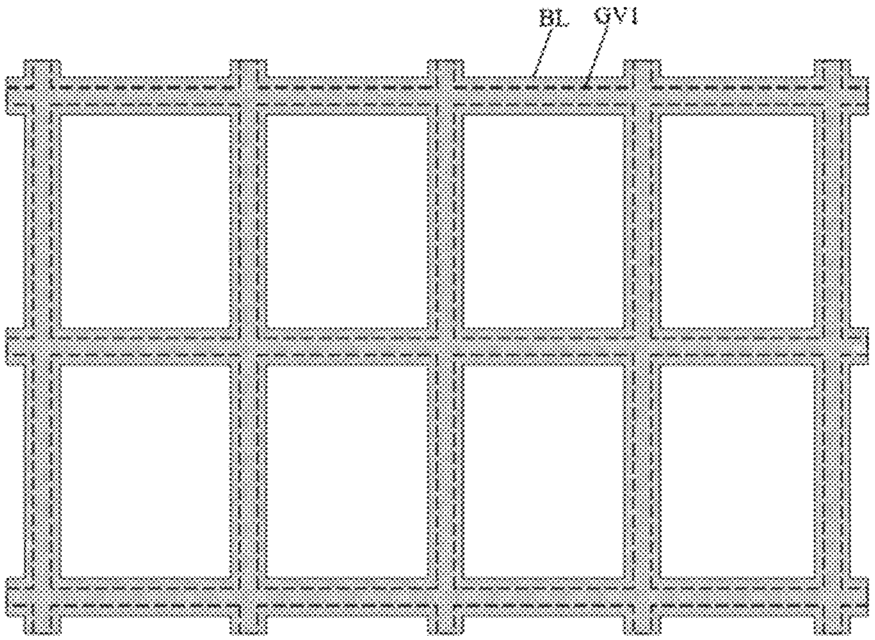
FIG. 26 is a plan view of a bank layer in a portion of a display panel in some embodiments according to the present disclosure.
Figure 27:
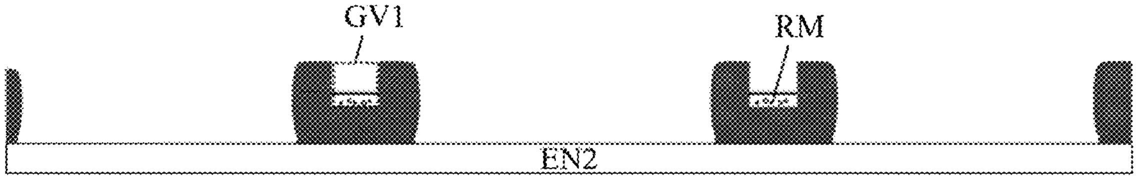
FIG. 27 is a cross-sectional view of a bank layer in a portion of a display panel in some embodiments according to the present disclosure.

FIG. 26 is a plan view of a bank layer in a portion of a display panel in some embodiments according to the present disclosure. FIG. 27 is a cross-sectional view of a bank layer in a portion of a display panel in some embodiments according to the present disclosure. Referring to FIG. 24, FIG. 26, and FIG. 27, in some embodiments, the display panel includes a first groove GV1 in the bank layer BL. Optionally, the first groove GV1 recesses into the bank layer BL along a direction from a respective color filter block configured to receive light emitted from a respective light emitting element to the respective light emitting element.

In some embodiments, a portion of the second encapsulating layer EN2 is received in the first groove GV1. In some embodiments, the display panel further includes a residual material RM in the first groove GV1. Optionally, the residual material RM includes quantum dots. Optionally, the residual material RM includes light scattering particles. In some embodiments, the residual material RM is between the second encapsulating layer EN2 and the bank layer BL. In one example, the residual material RM is in direct contact with the bank layer BL, and is in direct contact with the second encapsulating layer EN2. The inventors of the present disclosure discover that this unique structure is particularly conducive in preventing defects in the display panel due to the contamination caused by printing of the color conversion layer or the light scattering layer during a fabrication process of the display panel. The first groove GV1 receives the residual material RM spluttered during the printing process, avoiding it being deposited on the bank layer BL outside the black matrix region BMR.

In some embodiments, an orthographic projection of the black matrix BM on a base substrate BS at least partially overlaps with an orthographic projection of edges of the first groove GV1 on the base substrate BS. In some embodiments, the orthographic projection of the black matrix BM on the base substrate BS substantially covers (e.g., covers at least 70%, covers at least 75%, covers at least 80%, covers at least 85%, covers at least 90%, covers at least 95%, covers at least 99%, or completely covers) the orthographic projection of the edges of the first groove GV1 on the base substrate BS.

In some embodiments, an orthographic projection of the black matrix BM on a base substrate BS at least partially overlaps with an orthographic projection of the residual material RM on the base substrate BS. In some embodiments, the orthographic projection of the black matrix BM on the base substrate BS substantially covers (e.g., covers at least 70%, covers at least 75%, covers at least 80%, covers at least 85%, covers at least 90%, covers at least 95%, covers at least 99%, or completely covers) the orthographic projection of the residual material RM on the base substrate BS.

Figure 28:
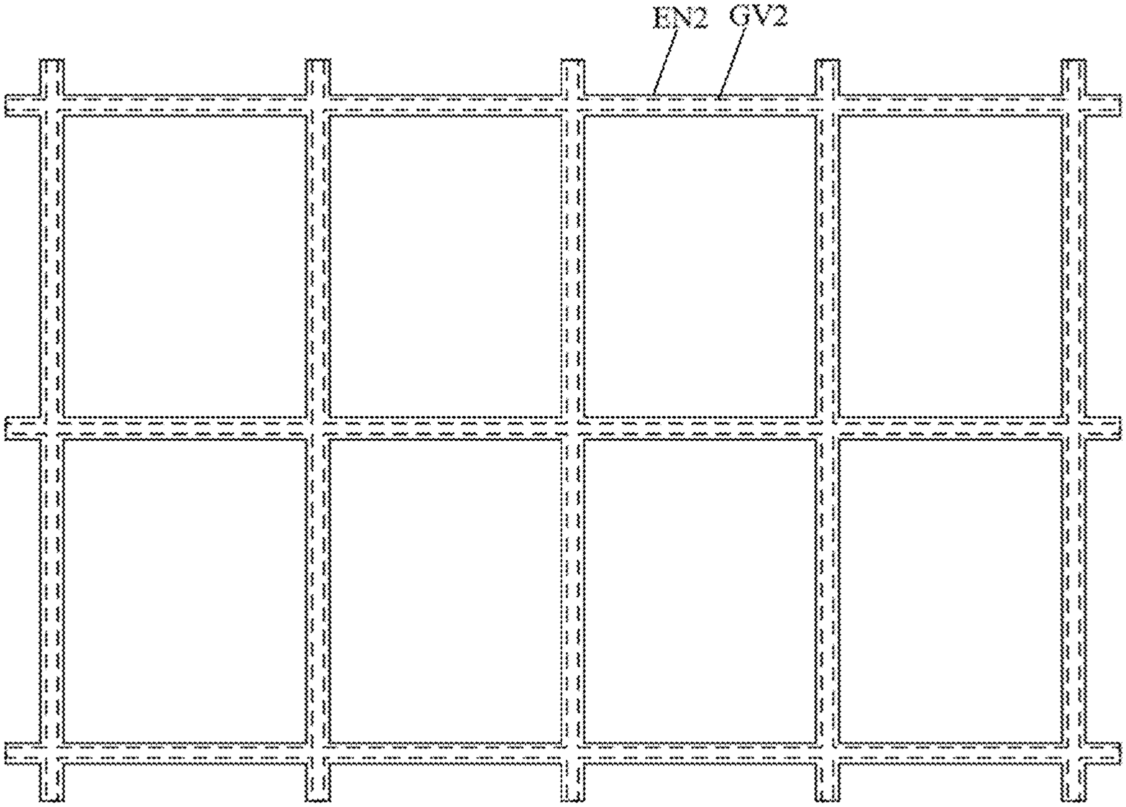
FIG. 28 is a plan view of a second encapsulating layer in a portion of a display panel in some embodiments according to the present disclosure.
Figure 29:
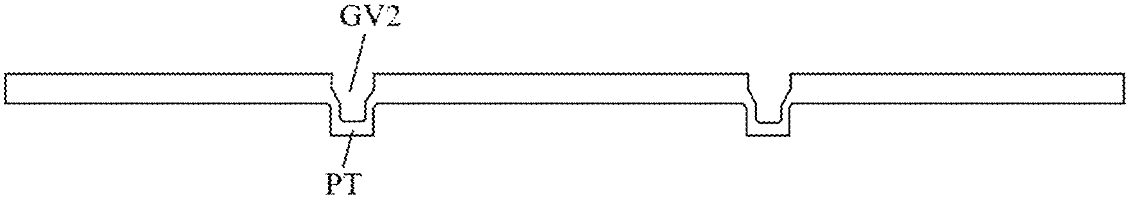
FIG. 29 is a cross-sectional view of a second encapsulating layer in a portion of a display panel in some embodiments according to the present disclosure.

FIG. 28 is a plan view of a second encapsulating layer in a portion of a display panel in some embodiments according to the present disclosure. FIG. 29 is a cross-sectional view of a second encapsulating layer in a portion of a display panel in some embodiments according to the present disclosure. Referring to FIG. 24, FIG. 28, and FIG. 29, the display panel includes a second groove GV2 in the second encapsulating layer EN2. Optionally, the second groove GV2 recesses into the second encapsulating layer EN2 along a direction from a respective color filter block configured to receive light emitted from a respective light emitting element to the respective light emitting element. In some embodiments, the second encapsulating layer EN2 includes a protrusion PT protruding into the first groove GV1, for example, the first groove GV1 is configured to receive at least a portion of the protrusion PT.

In some embodiments, an orthographic projection of the black matrix BM on a base substrate BS at least partially overlaps with an orthographic projection of edges of the second groove GV2 on the base substrate BS. In some embodiments, the orthographic projection of the black matrix BM on the base substrate BS substantially covers (e.g., covers at least 70%, covers at least 75%, covers at least 80%, covers at least 85%, covers at least 90%, covers at least 95%, covers at least 99%, or completely covers) the orthographic projection of the edges of the second groove GV2 on the base substrate BS.

In some embodiments, an orthographic projection of the black matrix BM on a base substrate BS at least partially overlaps with an orthographic projection of the protrusion PT on the base substrate BS. In some embodiments, the orthographic projection of the black matrix BM on the base substrate BS substantially covers (e.g., covers at least 70%, covers at least 75%, covers at least 80%, covers at least 85%, covers at least 90%, covers at least 95%, covers at least 99%, or completely covers) the orthographic projection of the protrusion PT on the base substrate BS.

In some embodiments, an orthographic projection of the bank layer BL on a base substrate BS at least partially overlaps with an orthographic projection of the protrusion PT on the base substrate BS. In some embodiments, the orthographic projection of the bank layer BL on the base substrate BS substantially covers (e.g., covers at least 70%, covers at least 75%, covers at least 80%, covers at least 85%, covers at least 90%, covers at least 95%, covers at least 99%, or completely covers) the orthographic projection of the protrusion PT on the base substrate BS.

In some embodiments, the protrusion PT is in direct contact with the residual material RM.

In some embodiments, referring to FIG. 24 to FIG. 29, the black matrix BM extends through the first gap GPI and extends into the second groove GV2. In some embodiments, the black matrix BM is in direct contact with the protrusion PT.

Figure 30:
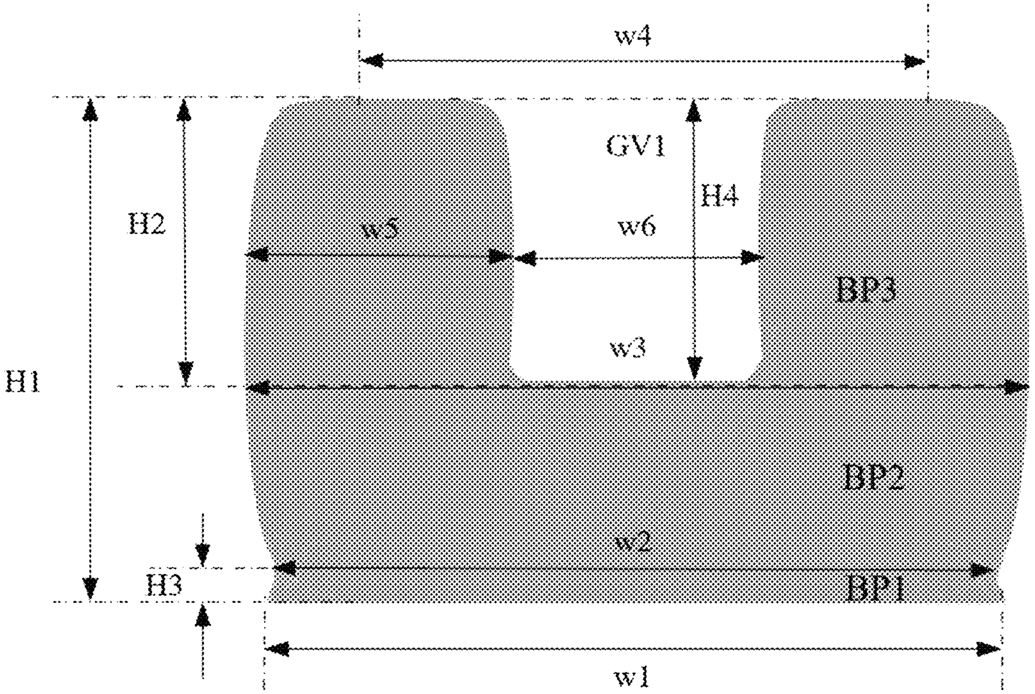
FIG. 30 is a cross-sectional view of a portion of a bank layer in a display panel in some embodiments according to the present disclosure.

FIG. 30 is a cross-sectional view of a portion of a bank layer in a display panel in some embodiments according to the present disclosure. Referring to FIG. 24 and FIG. 30, along a plane intersecting two adjacent subpixels and perpendicular to a surface of a base substrate BS, a cross-section of a portion of the bank layer BL between two adjacent color conversion blocks or between a color conversion block and a light scattering block adjacent to each other has a varying width along a direction from a respective light emitting element to a respective color filter block configured to receive light emitted from the respective light emitting element.

In some embodiments, along the plane intersecting two adjacent subpixels and perpendicular to a surface of a base substrate, a width of the cross-section transitions from a first width w1, to a second width w2, to a third width w3, and to a fourth width w4, along the direction from a respective light emitting element to a respective color filter block configured to receive light emitted from the respective light emitting element.

In some embodiments, $w2 \leq w1 \leq w3$. Optionally, $w4 \leq w2 \leq w1 \leq w3$.

In some embodiments, $(w3-w2)/w3 \leq 0.1$.

In some embodiments, along the plane intersecting two adjacent subpixels and perpendicular to a surface of a base substrate, a respective wall of two walls forming two opposite sides of the first groove GV1 has a fifth width w5. In some embodiments, along the plane intersecting two adjacent subpixels and perpendicular to a surface of a base substrate, the first groove GV1 has a sixth width w6. Optionally, the cross-section of the first groove GV1 along the plane intersecting two adjacent subpixels and perpendicular to a surface of a base substrate has a rectangular shape.

In some embodiments, w3/w6≥3.

In some embodiments, w6+w5*2≤w3.

In some embodiments, the bank layer BL includes a first bank portion BP1, a second bank portion BP2 on the first bank portion BP1, and a third bank portion BP3 on a side of the second bank portion BP2 away from the first bank portion BP1. Optionally, the third bank portion BP3 includes two walls forming two opposite sides of the first groove GV1.

In some embodiments, along the plane intersecting two adjacent subpixels and perpendicular to a surface of a base substrate, a cross-section of the first bank portion BP1 between two adjacent color conversion blocks or between a color conversion block and a light scattering block adjacent to each other has a first side having the first width w1 and a second side having the second width w2, the second side being opposite to the first side. In some embodiments, along the plane intersecting two adjacent subpixels and perpendicular to a surface of a base substrate, a cross-section of the second bank portion BP2 between two adjacent color conversion blocks or between a color conversion block and a light scattering block adjacent to each other has a third side having the second width w2 and a fourth side having the third width w3, the fourth side being opposite to the third side. In some embodiments, along the plane intersecting two adjacent subpixels and perpendicular to a surface of a base substrate, a cross-section of the third bank portion BP3 between two adjacent color conversion blocks or between a color conversion block and a light scattering block adjacent to each other has a fifth side having the third width w3 and a sixth side having the fourth width w4, the sixth side being opposite to the fifth side. Optionally, the first bank portion BP1, the second bank portion BP2, and the third bank portion BP3 are parts of a unitary structure.

In some embodiments, along the plane intersecting two adjacent subpixels and perpendicular to a surface of a base substrate, a respective wall of two walls forming two opposite sides of the first groove GV1 has a fifth width w5. In some embodiments, along the plane intersecting two adjacent subpixels and perpendicular to a surface of a base substrate, the first groove GV1 has a sixth width w6.

In some embodiments, w2≤w1≤w3. Optionally, w4≤w2≤w1≤w3.

In some embodiments, (w3−w2)/w3≤0.1.

In some embodiments, w3/w6≥3.

In some embodiments, w6+w5*2≤w3.

In some embodiments, along the plane intersecting two adjacent subpixels and perpendicular to a surface of a base substrate, the portion of the bank layer BL between two adjacent color conversion blocks or between a color conversion block and a light scattering block adjacent to each other has a first thickness H1. In some embodiments, along the plane intersecting two adjacent subpixels and perpendicular to a surface of a base substrate, the third bank portion BP3 between two adjacent color conversion blocks or between a color conversion block and a light scattering block adjacent to each other has a second thickness H2. In some embodiments, along the plane intersecting two adjacent subpixels and perpendicular to a surface of a base substrate, the first bank portion BP1 between two adjacent color conversion blocks or between a color conversion block and a light scattering block adjacent to each other has a third thickness H3. In some embodiments, the first groove GV1 has a depth H4 along a direction from a respective light emitting element to a respective color filter block configured to receive light emitted from the respective light emitting element.

In some embodiments, 1≤w3/H1≤2.

In some embodiments, H2+H3≤H1.

In some embodiments, 0.3≤H2/H1≤0.7.

In some embodiments, H3/H1≤0.2.

In some embodiments, H4/H1≤0.5.

In one particular example, 10 μm≤H1≤15 μm.

In one particular example, the bank layer BL includes a negative photoresist material.

Figure 31:
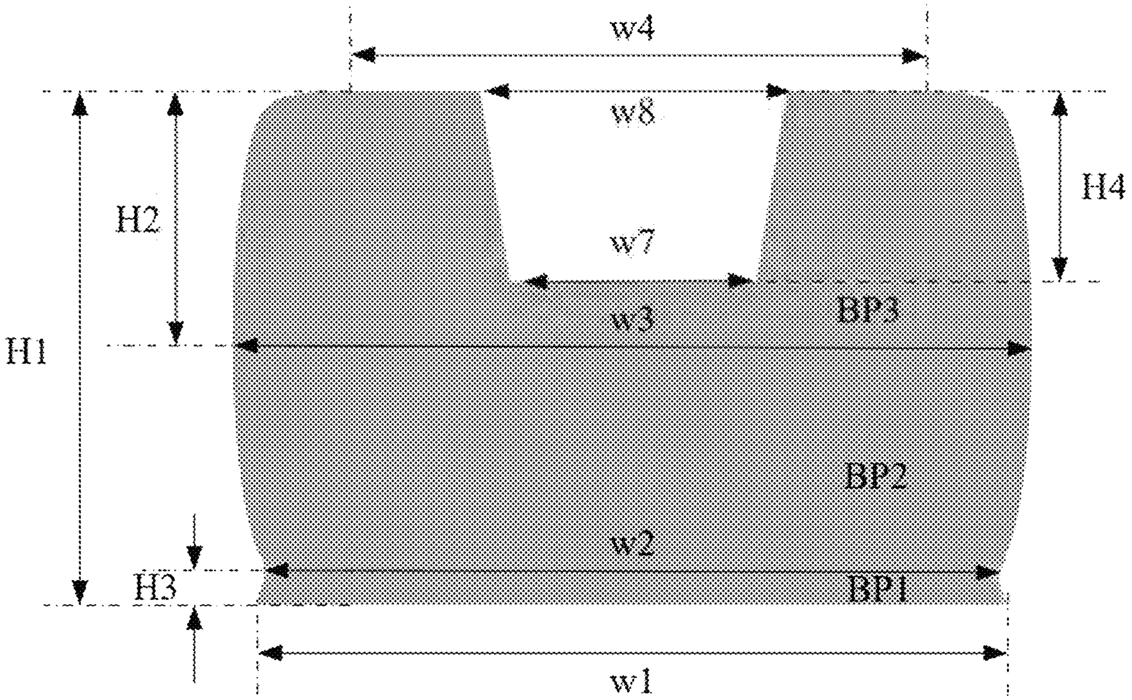
FIG. 31 is a cross-sectional view of a portion of a bank layer in a display panel in some embodiments according to the present disclosure.

FIG. 31 is a cross-sectional view of a portion of a bank layer in a display panel in some embodiments according to the present disclosure. Referring to FIG. 24 and FIG. 31, along a plane intersecting two adjacent subpixels and perpendicular to a surface of a base substrate BS, a cross-section of a portion of the bank layer BL between two adjacent color conversion blocks or between a color conversion block and a light scattering block adjacent to each other has a varying width along a direction from a respective light emitting element to a respective color filter block configured to receive light emitted from the respective light emitting element.

In some embodiments, along the plane intersecting two adjacent subpixels and perpendicular to a surface of a base substrate, a width of the cross-section transitions from a first width w1, to a second width w2, to a third width w3, and to a fourth width w4, along the direction from a respective light emitting element to a respective color filter block configured to receive light emitted from the respective light emitting element.

In some embodiments, w2≤w1≤w3. Optionally, w4≤w2≤w1≤w3.

In some embodiments, (w3−w2)/w3≤0.1.

In some embodiments, along the plane intersecting two adjacent subpixels and perpendicular to a surface of a base substrate, a cross-section of the first groove GV1 has a shape with a first base and a second base, wherein the first base is on a bottom of the first groove GV1, and the second base is opposite to the first base. Optionally, the first base has a seventh width w7, and the second base has an eighth width w8. In one particular example, the cross-section of the first groove GV1 has an inverted trapezoidal shape.

In some embodiments, 1≤w8/w7≤1.5.

In some embodiments, w3/w8≥3.

In some embodiments, the bank layer BL includes a first bank portion BP1, a second bank portion BP2 on the first bank portion BP1, and a third bank portion BP3 on a side of the second bank portion BP2 away from the first bank portion BP1. Optionally, the third bank portion BP3 includes two walls forming two opposite sides of the first groove GV1.

In some embodiments, along the plane intersecting two adjacent subpixels and perpendicular to a surface of a base substrate, a cross-section of the first bank portion BP1 between two adjacent color conversion blocks or between a color conversion block and a light scattering block adjacent to each other has a first side having the first width w1 and a second side having the second width w2, the second side being opposite to the first side. In some embodiments, along the plane intersecting two adjacent subpixels and perpendicular to a surface of a base substrate, a cross-section of the second bank portion BP2 between two adjacent color conversion blocks or between a color conversion block and a light scattering block adjacent to each other has a third side having the second width w2 and a fourth side having the third width w3, the fourth side being opposite to the third side. In some embodiments, along the plane intersecting two adjacent subpixels and perpendicular to a surface of a base substrate, a cross-section of the third bank portion BP3 between two adjacent color conversion blocks or between a color conversion block and a light scattering block adjacent to each other has a fifth side having the third width w3 and a sixth side having the fourth width w4, the sixth side being opposite to the fifth side. Optionally, the first bank portion BP1, the second bank portion BP2, and the third bank portion BP3 are parts of a unitary structure.

In some embodiments, along the plane intersecting two adjacent subpixels and perpendicular to a surface of a base substrate, a respective wall of two walls forming two opposite sides of the first groove GV1 has a fifth width w5. In some embodiments, along the plane intersecting two adjacent subpixels and perpendicular to a surface of a base substrate, a cross-section of the first groove GV1 has a shape with a first base and a second base, wherein the first base is on a bottom of the first groove GV1, and the second base is opposite to the first base. Optionally, the first base has a seventh width w7, and the second base has an eighth width w8. In one particular example, the cross-section of the first groove GV1 has an inverted trapezoidal shape.

In some embodiments, $w2 \leq w1 \leq w3$. Optionally, $w4 \leq w2 \leq w1 \leq w3$.

In some embodiments, $(w3-w2)/w3 \leq 0.1$.

In some embodiments, $1 \leq w8/w7 \leq 1.5$.

In some embodiments, $w3/w8 \geq 3$.

In some embodiments, along the plane intersecting two adjacent subpixels and perpendicular to a surface of a base substrate, the portion of the bank layer BL between two adjacent color conversion blocks or between a color conversion block and a light scattering block adjacent to each other has a first thickness H1. In some embodiments, along the plane intersecting two adjacent subpixels and perpendicular to a surface of a base substrate, the third bank portion BP3 between two adjacent color conversion blocks or between a color conversion block and a light scattering block adjacent to each other has a second thickness H2. In some embodiments, along the plane intersecting two adjacent subpixels and perpendicular to a surface of a base substrate, the first bank portion BP1 between two adjacent color conversion blocks or between a color conversion block and a light scattering block adjacent to each other has a third thickness H3. In some embodiments, the first groove GV1 has a depth H4 along a direction from a respective light emitting element to a respective color filter block configured to receive light emitted from the respective light emitting element.

In some embodiments, $1 \leq w3/H1 \leq 2$.

In some embodiments, $H2+H3 \leq H1$.

In some embodiments, $0.3 \leq H2/H1 \leq 0.7$.

In some embodiments, $H3/H1 \leq 0.2$.

In some embodiments, $H4/H1 \leq 0.5$.

In one particular example, $10\ \mu m \leq H1 \leq 15\ \mu m$.

In one particular example, the bank layer BL includes a negative photoresist material.

Figure 32:
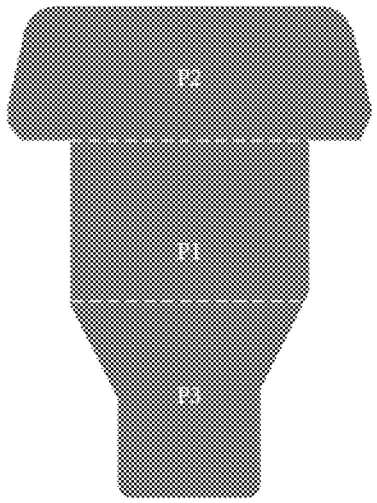
FIG. 32 is a cross-sectional view of a portion of a black matrix in a display panel in some embodiments according to the present disclosure.

FIG. 32 is a cross-sectional view of a portion of a black matrix in a display panel in some embodiments according to the present disclosure. Referring to FIG. 24 and FIG. 32, the black matrix BM in some embodiments includes a first portion P1, a second portion P2, and a third portion P3. In some embodiments, the first portion P1 is connected to the second portion P2, and is connected to the third portion P3. In some embodiments, the first portion P1, the second portion P2, and the third portion P3 are parts of a unitary structure. In some embodiments, the first portion P1 is at least partially inside the gap GP, the second portion P2 is at least partially outside the gap GP, and the third portion P3 is at least partially inside the second groove GV2.

In some embodiments, the third portion P3 is in direct contact with the second encapsulating layer EN2. In some embodiments, the first portion P1 is in direct contact with the color filter CF.

In some embodiments, along a plane intersecting two adjacent subpixels and perpendicular to a surface of a base substrate, a cross-section of the first portion P1 has a rectangular shape or a substantially rectangular shape (e.g., with one or more snip corners). In some embodiments, along the plane intersecting two adjacent subpixels and perpendicular to a surface of the base substrate, a cross-section of the second portion P2 has a trapezoidal shape or a substantially trapezoidal shape (e.g., with one or more snip corners). In some embodiments, along the plane intersecting two adjacent subpixels and perpendicular to a surface of the base substrate, a cross-section of the third portion P3 has a shape of a combination of an inverted trapezoidal shape (or an inverted substantially trapezoidal shape) and a rectangular shape (or a substantially rectangular shape). In some embodiments, along the plane intersecting two adjacent subpixels and perpendicular to a surface of the base substrate, a minimum width of the second portion P2 is greater than a maximum width of the first portion P1, and is greater than a maximum width of the third portion P3.

Figure 33:
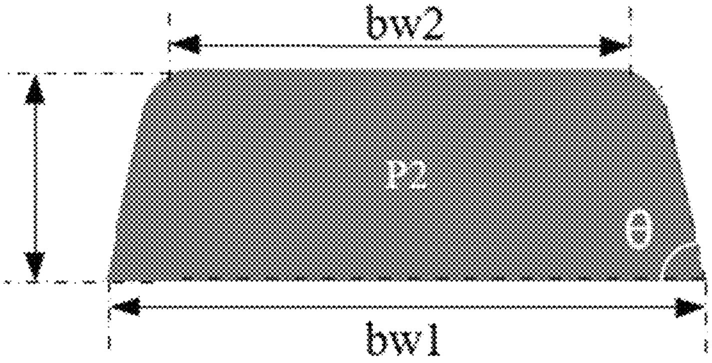
FIG. 33 is a cross-sectional view of a second portion of a black matrix in a display panel in some embodiments according to the present disclosure.

FIG. 33 is a cross-sectional view of a second portion of a black matrix in a display panel in some embodiments according to the present disclosure. Referring to FIG. 24 and FIG. 33, in some embodiments, along the plane intersecting two adjacent subpixels and perpendicular to a surface of the base substrate, a cross-section of the second portion P2 of the black matrix BM in a light non-transmissive region NTR between two adjacent light transmissive regions has a trapezoidal shape or a substantially trapezoidal shape (e.g., with one or more snip corners) In some embodiments, along the plane intersecting two adjacent subpixels and perpendicular to a surface of the base substrate, the cross-section of the second portion P2 of the black matrix BM in a light non-transmissive region NTR between two adjacent light transmissive regions has a first base having a first base width bw1 and a second base having a second base width bw2, the first base and the second base being opposite to each other. Optionally, the second base is on a side of the first base away from the base substrate BS. The first base width bw1 is greater than the second base width bw2. In some embodiments, along the plane intersecting two adjacent subpixels and perpendicular to a surface of the base substrate, the second portion P2 of the black matrix BM in a light non-transmissive region NTR between two adjacent light transmissive regions has a thickness BH. In some embodiments, the cross-section of the second portion P2 of the black matrix BM in a light non-transmissive region NTR between two adjacent light transmissive regions has a first base angle θ. The first base angle θ is an included angle between the first base and a leg of the portion of the black matrix BM in a light non-transmissive region NTR between two adjacent light transmissive regions.

In some embodiments, $1 \leq bw1/BH \leq 4$.

In some embodiments, $0.75 \leq bw2/bw1 \leq 1$.

In some embodiments, 60 degrees $\leq \theta \leq$ 90 degrees.

In one particular example, $1\ \mu m \leq BH \leq 3\ \mu m$.

Figure 34:
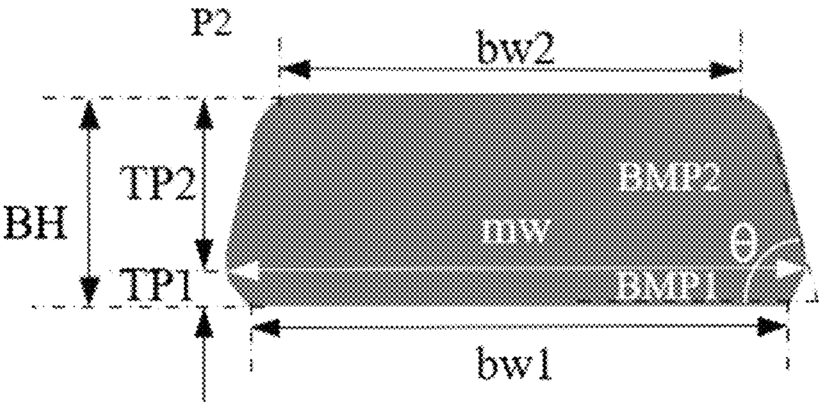
FIG. 34 is a cross-sectional view of a second portion of a black matrix in a display panel in some embodiments according to the present disclosure.

FIG. 34 is a cross-sectional view of a second portion of a black matrix in a display panel in some embodiments according to the present disclosure. Referring to FIG. 24 and FIG. 34, in some embodiments, along the plane intersecting two adjacent subpixels and perpendicular to a surface of the base substrate, a cross-section of the second portion P2 of the black matrix BM in a light non-transmissive region NTR between two adjacent light transmissive regions has a trapezoidal shape or a substantially trapezoidal shape (e.g., with one or more snip corners).

In some embodiments, along the plane intersecting two adjacent subpixels and perpendicular to a surface of the base substrate, the cross-section of the second portion P2 of the black matrix BM in a light non-transmissive region NTR between two adjacent light transmissive regions has a varying width along a direction from a respective light emitting element to a respective color filter block configured to receive light emitted from the respective light emitting element.

In some embodiments, along the plane intersecting two adjacent subpixels and perpendicular to a surface of the base substrate, a width of the cross-section of the second portion P2 of the black matrix BM in a light non-transmissive region NTR between two adjacent light transmissive regions transitions from a first base width bw1, to a maximum width mw, and to a second base width bw2, along the direction from a respective light emitting element to a respective color filter block configured to receive light emitted from the respective light emitting element.

In some embodiments, $1 \leq mw/H \leq 4$.

In some embodiments, $0.75 \leq bw2/mw \leq 1$.

In some embodiments, $0.75 \leq bw1/mw \leq 1$.

In some embodiments, 60 degrees$\leq \theta \leq$90 degrees.

In one particular example, 1 $\mu$m$\leq$BH$\leq$3 $\mu$m.

In some embodiments, the second portion P2 of the black matrix BM includes a first black matrix portion BMP1 and a second black matrix portion BMP2 on a side of the first black matrix portion BMP1 away from the base substrate. In some embodiments, along the plane intersecting two adjacent subpixels and perpendicular to a surface of a base substrate, a cross-section of the first black matrix portion BMP1 of the second portion P2 in a light non-transmissive region NTR between two adjacent light transmissive regions has a first side having the first base width bw1 and a second side having the maximum width mw, the second side being opposite to the first side. In some embodiments, along the plane intersecting two adjacent subpixels and perpendicular to a surface of a base substrate, a cross-section of the second black matrix portion BMP2 of the second portion P2 in a light non-transmissive region NTR between two adjacent light transmissive regions has a third side having the maximum width mw and a fourth side having the second base width bw2, the fourth side being opposite to the third side. Optionally, the first black matrix portion BMP1 and the second black matrix portion BMP2 are parts of a unitary structure. Optionally, the first black matrix portion BMP1, the second black matrix portion BMP2, and the first portion P1 are parts of a unitary structure. Optionally, the first black matrix portion BMP1 has a substantially inverted trapezoidal shape, and the second black matrix portion BMP2 has a substantially trapezoidal shape. Optionally, the substantially inverted trapezoidal shape and the substantially trapezoidal shape share a longer base.

In some embodiments, along the plane intersecting two adjacent subpixels and perpendicular to a surface of the base substrate, the second portion P2 of the black matrix BM in a light non-transmissive region NTR between two adjacent light transmissive regions has a thickness BH. In some embodiments, along the plane intersecting two adjacent subpixels and perpendicular to a surface of the base substrate, the first black matrix portion BMP1 of second portion P2 in a light non-transmissive region NTR between two adjacent light transmissive regions has a first portion thickness TP1. In some embodiments, along the plane intersecting two adjacent subpixels and perpendicular to a surface of the base substrate, the second black matrix portion BMP2 of the second portion P2 in a light non-transmissive region NTR between two adjacent light transmissive regions has a second portion thickness TP2. The first base angle $\theta$ is an included angle between the first base and a leg of the second black matrix portion BMP2.

In some embodiments, TP1+TP2=BH.

In some embodiments, $1 \leq mw/BH \leq 4$.

In some embodiments, $0.75 \leq bw2/mw \leq 1$.

In some embodiments, $0.75 \leq bw1/mw \leq 1$.

In some embodiments, 60 degrees$\leq \theta \leq$90 degrees.

In one particular example, 1 $\mu$m$\leq$BH$\leq$3 $\mu$m.

Figure 35:
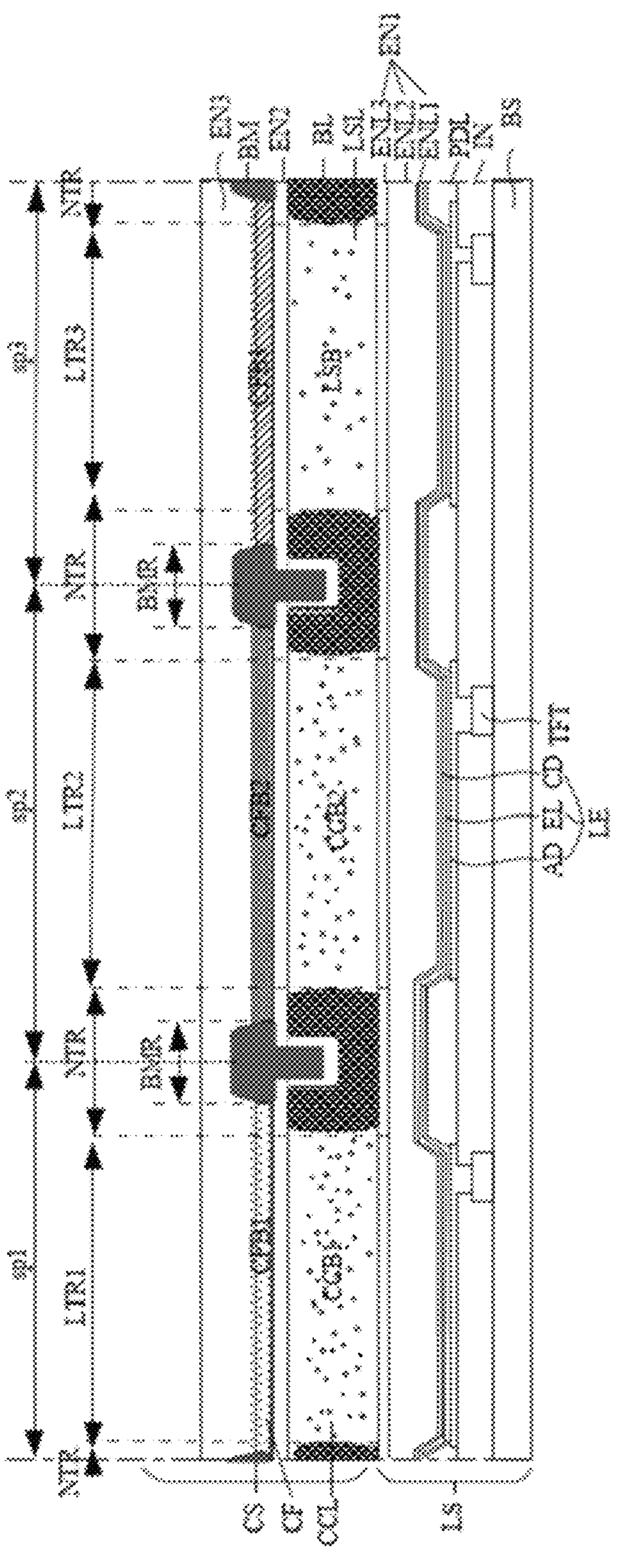
FIG. 35 is a schematic diagram illustrating the structure of a display panel in some embodiments according to the present disclosure.

Various alternative implementations may be practiced in the present disclosure. FIG. 35 is a schematic diagram illustrating the structure of a display panel in some embodiments according to the present disclosure. The display panel depicted in FIG. 35 differs from the display panel depicted in FIG. 24 in that the black matrix BM depicted in FIG. 35 has a different shape from the black matrix BM depicted in FIG. 24.

Figure 36:
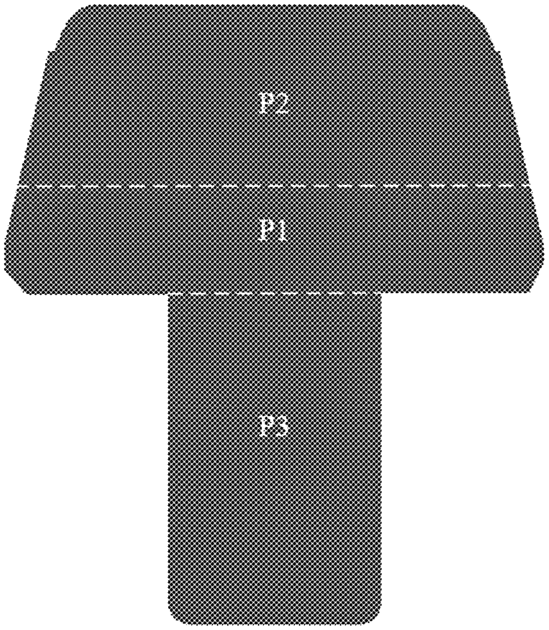
FIG. 36 is a cross-sectional view of a portion of a black matrix in a display panel in some embodiments according to the present disclosure.

FIG. 36 is a cross-sectional view of a portion of a black matrix in a display panel in some embodiments according to the present disclosure, Referring to FIG. 35 and FIG. 36, the black matrix BM in some embodiments includes a first portion P1, a second portion P2, and a third portion P3. In some embodiments, the first portion P1 is connected to the second portion P2, and is connected to the third portion P3. In some embodiments, the first portion P1, the second portion P2, and the third portion P3 are parts of a unitary structure. In some embodiments, the first portion P1 is at least partially inside the gap, the second portion P2 is at least partially outside the gap, and the third portion is at least partially in the second groove.

In some embodiments, the third portion P3 is in direct contact with the second encapsulating layer EN2. In some embodiments, the first portion P1 is in direct contact with the color filter CF. In some embodiments, the second portion P2 is in direct contact with the third encapsulating layer EN3.

In some embodiments, along a plane intersecting two adjacent subpixels and perpendicular to a surface of a base substrate, a cross-section of the first portion P1 has a trapezoidal shape or a substantially trapezoidal shape (e.g., with one or more snip corners). In some embodiments, along the plane intersecting two adjacent subpixels and perpendicular to a surface of the base substrate, a cross-section of the second portion P2 has a trapezoidal shape or a substantially trapezoidal shape (e.g., with one or more snip corners). In some embodiments, along the plane intersecting two adjacent subpixels and perpendicular to a surface of the base substrate, a cross-section of the third portion P3 has a rectangular shape or a substantially rectangular shape (e.g., with one or more snip corners). In some embodiments, along the plane intersecting two adjacent subpixels and perpendicular to a surface of the base substrate, a minimum width of the first portion P1 is greater than a maximum width of the second portion P2, a minimum width of the second portion P2 is greater than the maximum width of the third portion P3. The inventors of the present disclosure discover that this unique structure is conducive to enhancing attachment of the black matrix BM to the second encapsulating layer EN2, effectively avoiding peeling of the black matrix BM.

In another aspect, the present disclosure provides a display apparatus, comprising the display panel described herein or fabricated by a method described herein, and one or more integrated circuits connected to the display panel. Examples of appropriate display apparatuses include, but are not limited to, an electronic paper, a mobile phone, a tablet computer, a television, a monitor, a notebook computer, a digital album, a GPS, etc.

In another aspect, the present disclosure provides a display panel comprising a color conversion substrate described herein or fabricated by a method described herein, and a light emitting substrate.

Figure 37A:
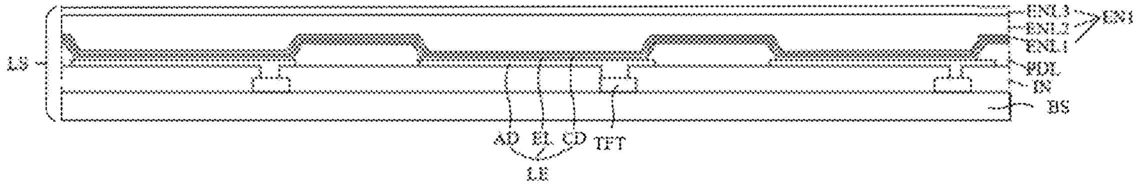
FIG. 37A to 37F illustrate a process of fabricating a display panel in some embodiments according to the present disclosure.

In another aspect, the present disclosure provides a method of fabricating a color conversion substrate. FIG. 37A to 37F illustrate a process of fabricating a display panel in some embodiments according to the present disclosure. Referring to FIG. 37A, a light emitting substrate LS is formed. In some embodiments, the light emitting substrate LS is formed to include a base substrate BS; a plurality of thin film transistor TFT (e.g., transistors in pixel driving circuits) on the base substrate BS; an insulating layer IN on a side of the plurality of transistor TFT away from the base substrate BS; a pixel definition layer PDL and a plurality of light emitting elements LE on a side of the insulating layer IN away from the base substrate BS; and a first encapsulating layer EN1 on a side of the plurality of light emitting elements LE and the pixel definition layer PDL away from the base substrate BS. A respective light emitting element of the plurality of light emitting elements LE includes an anode AD, a light emitting layer EL on a side of the anode AD away from the base substrate BS, and a cathode CD on a side of the light emitting layer EL away from the base substrate BS. In one example, the first encapsulating layer EN1 include a first inorganic encapsulating sublayer ENL1, an organic encapsulating sublayer ENL2 on a side of the first inorganic encapsulating sublayer ENL1 away from the base substrate BS, and a second inorganic encapsulating sublayer ENL3 on a side of the organic encapsulating sublayer ENL2 away from the base substrate BS.

Figure 37B:
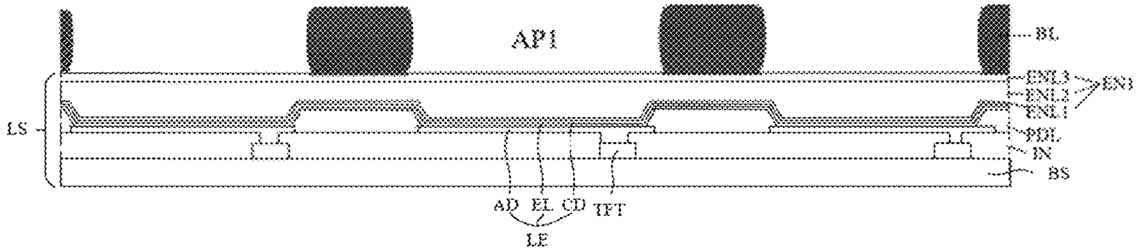

Referring to FIG. 37B, a bank layer BL is formed on a side of the first encapsulating layer EN1 away from the base substrate BS. A plurality of first apertures AP1 are formed extending through the bank layer BL.

Figure 37C:
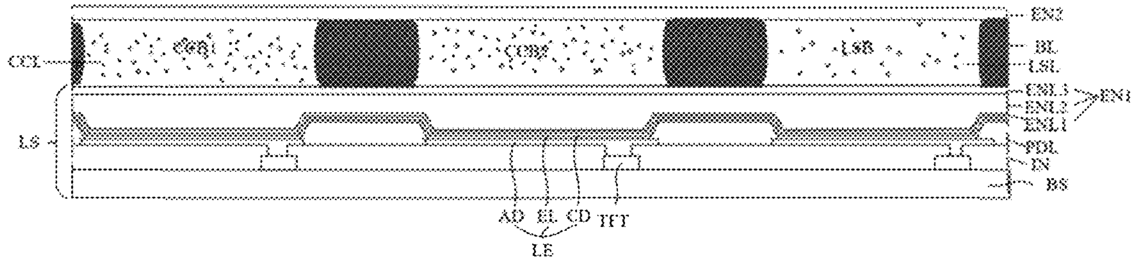

Referring to FIG. 37C, a color conversion layer CCL and a light scattering layer LSL are formed. The color conversion layer CCL is formed to include a plurality of color conversion blocks CCB. The light scattering layer LSL is formed to include a plurality of light scattering blocks LSB. A respective color conversion block of the plurality of color conversion blocks CCB or a respective light scattering block of the plurality of light scattering blocks LSB is formed at least partially in a respective first aperture of the plurality of first apertures AP1. Subsequently, a second encapsulating layer EN2 is formed on a side of the bank layer BL, the color conversion layer CCL, and the light scattering layer LSL away from the base substrate BS.

Figure 37D:
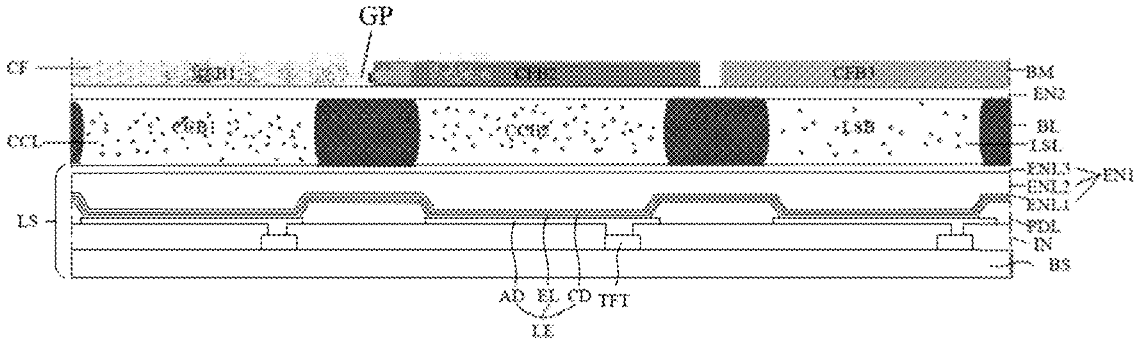

Referring to FIG. 37D, a color filter CF is formed on a side of the second encapsulating layer EN2 away from the base substrate BS. A gap GP is formed extending at least partially into (e.g., extending through) the color filter CF, dividing the color filter CF into a plurality of color filter blocks including a first color filter block CFB1, a second color filter block CFB2, and a third color filter block CFB3.

Figure 37E:
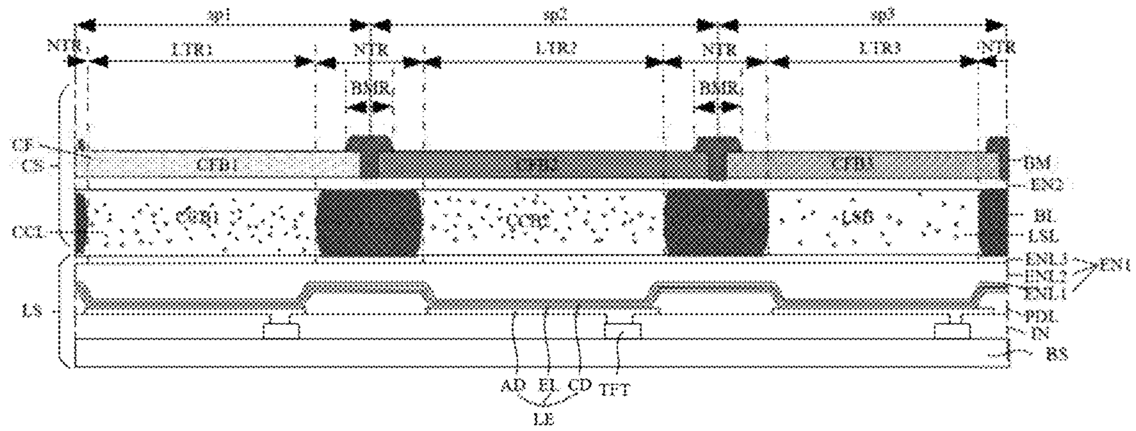

Referring to FIG. 37E, a black matrix BM is formed on a side of the color filter CF away from the base substrate BS. The black matrix BM is formed extending into the gap GP. In some embodiments, the black matrix BM is formed to be in direct contact with the second encapsulating layer EN2.

Figure 37F:
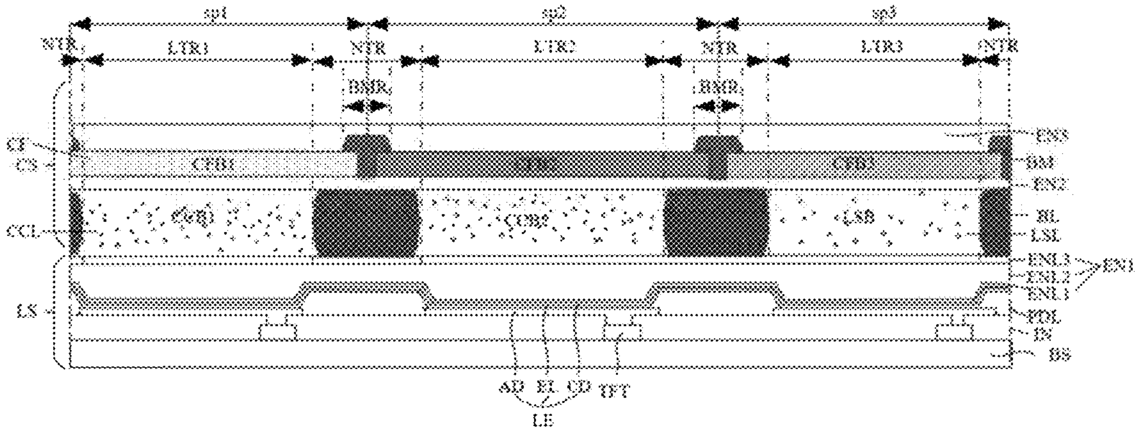

Referring to FIG. 37F, a third encapsulating layer EN3 is formed on a side of the black matrix BM and the color filter CF away from the base substrate BS, thereby forming the color conversion substrate CS.

In some embodiments, the method includes forming a bank layer; forming a plurality of first apertures extending through the bank layer; and forming a color conversion layer comprising a plurality of color conversion blocks. Optionally, a respective color conversion block of the plurality of color conversion blocks is at least partially in a first aperture of the plurality of first apertures. Optionally, along a plane intersecting two adjacent subpixels and perpendicular to a surface of a base substrate, a cross-section of a portion of the bank layer between two adjacent color conversion blocks transitions from a first width, to a second width, to a third width, and to a fourth width, along a direction from a respective light emitting element to a respective color filter block configured to receive light emitted from the respective light emitting element. Optionally, the third width is equal to or greater than the first width. Optionally, the first width is equal to or greater than the second width. Optionally, the second width is equal to or greater than the fourth width.

In some embodiments, a ratio of a difference between the third width and the second width to the third width is equal to or less than 0.1.

In some embodiments, forming the bank layer includes, between two adjacent color conversion blocks, forming a first bank portion, forming a second bank portion on the first bank portion, and forming a third bank portion on a side of the second bank portion away from the first bank portion. Optionally, along the plane intersecting two adjacent subpixels and perpendicular to the surface of the base substrate, a cross-section of the first bank portion has a first side having the first width and a second side having the second width, the second side being opposite to the first side; a cross-section of the second bank portion has a third side having the second width and a fourth side having the third width, the fourth side being opposite to the third side; a cross-section of the third bank portion has a fifth side having the third width and a sixth side having the fourth width, the sixth side being opposite to the fifth side. Optionally, the portion of the bank layer has a first thickness; the third bank portion has a second thickness; and the first bank portion has a third thickness. Optionally, a ratio of the third width to the first thickness is equal to or greater than 1, and equal to or less than 2.

In some embodiments, a ratio of the second thickness to the first thickness is equal to or greater than 0.3, and is equal to or less than 0.7.

In some embodiments, a ratio of the third thickness to the first thickness is equal to or less than 0.2.

In some embodiments, the method further includes forming a first groove recessing into the bank layer along the direction from the respective color filter block configured to receive light emitted from the respective light emitting element to the respective light emitting element.

In some embodiments, the method further includes forming a residual material in the first groove. Optionally, the residual material comprises at least one of quantum dots or light scattering particles.

In some embodiments, the method further includes forming a second encapsulating layer on a side of the bank layer and the color conversion layer away from the base substrate.

Optionally, forming the second encapsulating layer includes forming a protrusion protruding into the first groove.

In some embodiments, the method further includes forming a second groove recessing into the second encapsulating layer along the direction from the respective color filter block configured to receive light emitted from the respective light emitting element to the respective light emitting element.

In some embodiments, the method further includes forming a black matrix and a color filter on a side of the second encapsulating layer away from the base substrate; and forming a gap extending through the color filter, dividing the color filter into a plurality of color filter blocks. Optionally, the black matrix is formed to extend through the gap and extends into the second groove.

In some embodiments, an orthographic projection of the black matrix on the base substrate substantially covers an orthographic projection of edges of the second groove on the base substrate. Optionally, an orthographic projection of the black matrix on the base substrate substantially covers an orthographic projection of the protrusion on the base substrate. Optionally, an orthographic projection of the bank layer on the base substrate substantially covers the orthographic projection of the protrusion on the base substrate.

In some embodiments, the protrusion is formed to be in direct contact with a residual material.

In some embodiments, forming the bank layer includes, between two adjacent color conversion blocks, forming a first bank portion, forming a second bank portion on the first bank portion, and forming a third bank portion on a side of the second bank portion away from the first bank portion. Optionally, the first groove recesses into the third bank portion. Optionally, the portion of the bank layer has a first thickness. Optionally, the first groove has a depth along the direction from the respective light emitting element to the respective color filter block configured to receive light emitted from the respective light emitting element. Optionally, a ratio of the depth to the first thickness is equal to or less than 0.5.

In some embodiments, along the plane intersecting two adjacent subpixels and perpendicular to the surface of the base substrate, a respective wall of two walls forming two opposite sides of the first groove has a fifth width, the first groove has a sixth width, and a cross-section of the first groove has a rectangular shape. Optionally, a ratio of the third width to the sixth width is equal to or greater than 3.

In some embodiments, the third width is equal to or greater than a sum of the sixth width and two times of the fifth width.

In some embodiments, along the plane intersecting two adjacent subpixels and perpendicular to the surface of the base substrate, a cross-section of the first groove has a shape having a first base and a second base, wherein the first base is on a bottom of the first groove, and the second base is opposite to the first base. Optionally, the first base has a seventh width. Optionally, the second base has an eighth width. Optionally, a ratio of the eighth width to the seventh width is equal to or greater than 1, and equal to or less than 1.5.

In some embodiments, a ratio of the third width to the seventh width is equal to or greater than 3.

In some embodiments, the method further includes forming a second encapsulating layer on a side of the bank layer and the color conversion layer away from the base substrate; and forming a black matrix and a color filter on a side of the second encapsulating layer away from the base substrate. Optionally, forming the black matrix includes forming a portion on a side of the color filter away from the base substrate. Optionally, along the plane intersecting two adjacent subpixels and perpendicular to the surface of the base substrate, a cross-section of the portion of the black matrix in a light non-transmissive region between two adjacent light transmissive regions has a first base having a first base width, a second base having a second base width, and a first base angle between the first base and a leg of the cross-section, the first base and the second base being opposite to each other. Optionally, the second base is on a side of the first base away from the base substrate. Optionally, along the plane intersecting two adjacent subpixels and perpendicular to the surface of the base substrate, the portion of the black matrix in the light non-transmissive region between two adjacent light transmissive regions has a thickness. Optionally, a ratio of the first base width to the thickness is equal to or greater than 1, and equal to or less than 4. Optionally, a ratio of the second base width to the first base width is equal to or greater than 0.75, and equal to or less than 1. Optionally, the first base angle is equal to or greater than 60 degrees, and equal to or less than 90 degrees.

In some embodiments, the method further includes forming a second encapsulating layer on a side of the bank layer and the color conversion layer away from the base substrate; and forming a black matrix and a color filter on a side of the second encapsulating layer away from the base substrate. Optionally, forming the black matrix includes forming a portion on a side of the color filter away from the base substrate. Optionally, along the plane intersecting two adjacent subpixels and perpendicular to the surface of the base substrate, a width of a cross-section of the portion of the black matrix in a light non-transmissive region between two adjacent light transmissive regions transitions from a first base width, to a maximum width, and to a second base width, along the direction from the respective light emitting element to the respective color filter block configured to receive light emitted from the respective light emitting element. Optionally, along the plane intersecting two adjacent subpixels and perpendicular to the surface of the base substrate, a cross-section of the portion of the black matrix in a light non-transmissive region between two adjacent light transmissive regions has a first base angle between a first base and a leg of the cross-section. Optionally, a ratio of the maximum width to the thickness is equal to or greater than 1, and equal to or less than 4. Optionally, a ratio of the first base width to the maximum width is equal to or greater than 0.75, and equal to or less than 1. Optionally, a ratio of the second base width to the maximum width is equal to or greater than 0.75, and equal to or less than 1. Optionally, the first base angle is equal to or greater than 60 degrees, and equal to or less than 90 degrees.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term “the invention”, “the present invention” or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use “first”, “second”, etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A color conversion substrate, comprising:

a bank layer;

a plurality of first apertures extending through the bank layer; and a color conversion layer comprising a plurality of color conversion blocks;

wherein a respective color conversion block of the plurality of color conversion blocks is at least partially in a first aperture of the plurality of first apertures;

along a plane intersecting two adjacent subpixels and perpendicular to a surface of a base substrate, a cross-section of a portion of the bank layer between two adjacent color conversion blocks transitions from a first width, to a second width, to a third width, and to a fourth width, along a direction from a respective light emitting element to a respective color filter block configured to receive light emitted from the respective light emitting element;

the third width is greater than the first width;

the first width is greater than the second width; and the second width is equal to or greater than the fourth width.

2. The color conversion substrate of claim 1, wherein a ratio of a difference between the third width and the second width to the third width is equal to or less than 0.1.

3. The color conversion substrate of claim 1, wherein, between two adjacent color conversion blocks, the bank layer comprises a first bank portion, a second bank portion on the first bank portion, and a third bank portion on a side of the second bank portion away from the first bank portion;

wherein, along the plane intersecting two adjacent subpixels and perpendicular to the surface of the base substrate:

a cross-section of the first bank portion has a first side having the first width and a second side having the second width, the second side being opposite to the first side;

a cross-section of the second bank portion has a third side having the second width and a fourth side having the third width, the fourth side being opposite to the third side;

a cross-section of the third bank portion has a fifth side having the third width and a sixth side having the fourth width, the sixth side being opposite to the fifth side;

the portion of the bank layer has a first thickness;

the third bank portion has a second thickness; and the first bank portion has a third thickness.

4. The color conversion substrate of claim 3, wherein a ratio of the third width to the first thickness is equal to or greater than 1, and equal to or less than 2.

5. The color conversion substrate of claim 3, wherein a ratio of the second thickness to the first thickness is equal to or greater than 0.3, and is equal to or less than 0.7.

6. The color conversion substrate of claim 3, wherein a ratio of the third thickness to the first thickness is equal to or less than 0.2.

7. The color conversion substrate of claim 6, wherein, between two adjacent color conversion blocks, the bank layer comprises a first bank portion, a second bank portion on the first bank portion, and a third bank portion on a side of the second bank portion away from the first bank portion;

the first groove recesses into the third bank portion;

the portion of the bank layer has a first thickness; and the first groove has a depth along the direction from the respective light emitting element to the respective color filter block configured to receive light emitted from the respective light emitting element;

wherein a ratio of the depth to the first thickness is equal to or less than 0.5.

8. The color conversion substrate of claim 1, further comprising a first groove recessing into the bank layer along a direction from the respective color filter block configured to receive light emitted from the respective light emitting element to the respective light emitting element.

9. The color conversion substrate of claim 8, further comprising a second encapsulating layer on a side of the bank layer and the color conversion layer away from the base substrate;

wherein the second encapsulating layer comprises a protrusion protruding into the first groove.

10. The color conversion substrate of claim 9, further comprising a second groove recessing into the second encapsulating layer along the direction from the respective color filter block configured to receive light emitted from the respective light emitting element to the respective light emitting element.

11. The color conversion substrate of claim 10, further comprising:

a black matrix and a color filter on a side of the second encapsulating layer away from the base substrate; and a gap extending through the color filter, dividing the color filter into a plurality of color filter blocks;

wherein the black matrix extends through the gap and extends into the second groove.

12. The color conversion substrate of claim 11, wherein an orthographic projection of the black matrix on the base substrate substantially covers an orthographic projection of edges of the second groove on the base substrate;

an orthographic projection of the black matrix on the base substrate substantially covers an orthographic projection of the protrusion on the base substrate; and an orthographic projection of the bank layer on the base substrate substantially covers the orthographic projection of the protrusion on the base substrate.

13. The color conversion substrate of claim 9, further comprising a residual material in the first groove;

wherein the residual material comprises at least one of quantum dots or light scattering particles; and the protrusion is in direct contact with the residual material.

14. The color conversion substrate of claim 8, wherein, along the plane intersecting two adjacent subpixels and perpendicular to the surface of the base substrate, a respective wall of two walls forming two opposite sides of the first groove has a fifth width, the first groove has a sixth width, and a cross-section of the first groove has a rectangular shape; and a ratio of the third width to the sixth width is equal to or greater than 3.

15. The color conversion substrate of claim 14, wherein the third width is equal to or greater than a sum of the sixth width and two times of the fifth width.

16. The color conversion substrate of claim 8, wherein, along the plane intersecting two adjacent subpixels and perpendicular to the surface of the base substrate, a cross-section of the first groove has a shape having a first base and a second base, wherein the first base is on a bottom of the first groove, and the second base is opposite to the first base;

the first base has a seventh width;

the second base has an eighth width; and a ratio of the eighth width to the seventh width is equal to or greater than 1, and equal to or less than 1.5.

17. The color conversion substrate of claim 16, wherein a ratio of the third width to the seventh width is equal to or greater than 3.

18. The color conversion substrate of claim 1, further comprising:

a second encapsulating layer on a side of the bank layer and the color conversion layer away from the base substrate; and a black matrix and a color filter on a side of the second encapsulating layer away from the base substrate;

wherein the black matrix comprises a portion on a side of the color filter away from the base substrate;

along the plane intersecting two adjacent subpixels and perpendicular to the surface of the base substrate, a cross-section of the portion of the black matrix in a light non-transmissive region between two adjacent light transmissive regions has a first base having a first base width, a second base having a second base width, and a first base angle between the first base and a leg of the cross-section, the first base and the second base being opposite to each other;

the second base is on a side of the first base away from the base substrate; and along the plane intersecting two adjacent subpixels and perpendicular to the surface of the base substrate, the portion of the black matrix in the light non-transmissive region between two adjacent light transmissive regions has a thickness;

wherein a ratio of the first base width to the thickness is equal to or greater than 1, and equal to or less than 4;

a ratio of the second base width to the first base width is equal to or greater than 0.75, and equal to or less than 1; and the first base angle is equal to or greater than 60 degrees, and equal to or less than 90 degrees.

19. The color conversion substrate of claim 1, further comprising:

a second encapsulating layer on a side of the bank layer and the color conversion layer away from the base substrate; and a black matrix and a color filter on a side of the second encapsulating layer away from the base substrate;

wherein the black matrix comprises a portion on a side of the color filter away from the base substrate;

along the plane intersecting two adjacent subpixels and perpendicular to the surface of the base substrate, a width of a cross-section of the portion of the black matrix in a light non-transmissive region between two adjacent light transmissive regions transitions from a first base width, to a maximum width, and to a second base width, along the direction from the respective light emitting element to the respective color filter block configured to receive light emitted from the respective light emitting element; and along the plane intersecting two adjacent subpixels and perpendicular to the surface of the base substrate, a cross-section of the portion of the black matrix in a light non-transmissive region between two adjacent light transmissive regions has a first base angle between a first base and a leg of the cross-section, and the portion of the black matrix in the light non-transmissive region between two adjacent light transmissive regions has a thickness;

wherein a ratio of the maximum width to the thickness is equal to or greater than 1, and equal to or less than 4;

a ratio of the first base width to the maximum width is equal to or greater than 0.75, and equal to or less than 1;

a ratio of the second base width to the maximum width is equal to or greater than 0.75, and equal to or less than 1; and the first base angle is equal to or greater than 60 degrees, and equal to or less than 90 degrees.

20. A display apparatus, comprising the color conversion substrate of claim 1, and a light emitting substrate.

* * * * *